(12) United States Patent
Lee et al.

(10) Patent No.: US 8,107,295 B2
(45) Date of Patent: Jan. 31, 2012

(54) NONVOLATILE MEMORY DEVICE AND READ METHOD THEREOF

(75) Inventors: Changhyun Lee, Gyeonggi-do (KR); Jungdal Choi, Seoul (KR); Byeong-In Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 12/607,518

(22) Filed: Oct. 28, 2009

(65) Prior Publication Data

US 2010/0124119 A1    May 20, 2010

(30) Foreign Application Priority Data

Nov. 14, 2008  (KR) .................. 10-2008-0113531

(51) Int. Cl.
*G11C 11/34* (2006.01)
*G11C 16/06* (2006.01)
*G11C 5/14* (2006.01)

(52) U.S. Cl. .......... 365/185.18; 365/185.22; 365/189.09

(58) Field of Classification Search ............. 365/185.18, 365/185.22, 189.09
See application file for complete search history.

(56) References Cited

U.S. PATENT DOCUMENTS

| 7,006,379 B2 | 2/2006 | Noguchi et al. |
| 7,009,881 B2 | 3/2006 | Noguchi |
| 2008/0101122 A1 | 5/2008 | Kang et al. |
| 2009/0238003 A1* | 9/2009 | Namiki et al. ........... 365/185.17 |
| 2010/0067299 A1* | 3/2010 | Futatsuyama ........... 365/185.17 |

FOREIGN PATENT DOCUMENTS

| JP | 2002-358792 | 12/2002 |
| JP | 2005-327409 | 11/2005 |
| KR | 1020030009090 A | 1/2003 |
| KR | 1020060047935 A | 5/2006 |

* cited by examiner

*Primary Examiner* — Ly D Pham
(74) *Attorney, Agent, or Firm* — Myers Bigel Sibley & Sajovec, P.A.

(57) ABSTRACT

An object of the present inventive concept is providing a nonvolatile memory device having improved reliability by compensating a threshold voltage of a flash memory cell.

A nonvolatile memory device according to the present inventive concept includes a memory cell array connected to a plurality of word lines; and a voltage generator for supplying a select read voltage to a select word line and an unselect read voltage to an unselect word line among the plurality of word lines when a read operation is performed. The voltage generator generates the unselect read voltage having a different level according to whether the unselect word line is adjacent to the select word line or not.

A nonvolatile memory device according to the present inventive concept compensates a threshold voltage increased or decreased due to various causes. According to the present inventive concept, reliability of a nonvolatile memory device is improved.

12 Claims, 24 Drawing Sheets

NONVOLATILE MEMORY DEVICE AND READ METHOD THEREOF

REFERENCE TO PRIORITY APPLICATION

This patent application claims priority to Korean Patent Application No. 2008-0113531, filed Nov. 14, 2008, the contents of which are hereby incorporated herein by reference.

FIELD OF THE INVENTION

The exemplary embodiments disclosed herein relate to nonvolatile memory devices, and more particularly, to nonvolatile memory devices including improved reliability and methods of reading the same.

BACKGROUND

Memory devices are used to store data. The memory devices are classified into volatile memory devices and nonvolatile memory devices. Data stored in volatile memory devices are disappeared when their power supplies are interrupted while data stored in nonvolatile memory devices are retained even when their power supplies are interrupted.

Since nonvolatile memory devices can store data using a low power, they are in the limelight as a storage medium of a portable device. There is a flash memory device as a kind of a nonvolatile memory device. In below, a flash memory device is described as an example of a nonvolatile memory device. However, a range of the present inventive concept is not limited to this but can be applied to other nonvolatile memory devices (e.g., a charge trap flash memory, PRAM, FRAM, MRAM or the like).

Data stored in a memory cell of a flash memory device (or a charge trap flash memory) is distinguished by measuring a threshold voltage of a memory cell. A threshold voltage of a memory cell is determined depending on the number of electrons stored in a floating gate. As the number of electrons stored in a floating gate increases, a threshold voltage becomes high.

Electrons stored in a floating gate may be leaked by many causes. Electrons stored in a floating gate may be leaked by an external stimulus (e.g., heat). Also, electrons stored in a floating gate may be leaked by wear of a memory cell. A repetition of an access operation in a flash memory device wears an insulating layer disposed between a channel region and a floating gate. The access operation includes a program operation, an erasing operation and a read operation. If an insulating layer is worn, charges stored in a floating gate are easily leaked. A decrease of a threshold voltage causes a read error, thereby degrading reliability of a flash memory device.

SUMMARY

Exemplary embodiments of the present inventive concept provide a nonvolatile memory device. The nonvolatile memory device may include a memory cell array connected to a plurality of word lines; and a voltage generator for supplying a select read voltage to a select word line and an unselect read voltage to an unselect word line among the plurality of word lines when a read operation is performed. The voltage generator generates the unselect read voltage having a different level according to whether the unselect word line is adjacent to the select word line or not.

Exemplary embodiments of the present inventive concept provide a read method of a nonvolatile memory device. The read method may include performing a first read operation by supplying a select read voltage to a select word line and supplying an unselect read voltage to an unselect word line; detecting whether an error occurs in the first read operation or not; and performing a second read operation by changing a voltage of a word line adjacent to the select word line when an error occurs in the first read operation.

Exemplary embodiments of the present inventive concept provide a read method of a nonvolatile memory device. The read method may include performing a read operation by supplying an select read voltage to a monitoring word line and supplying an unselect read voltage to an unselect word line; detecting whether data stored in a monitoring cell connected to the monitoring word line is normally readout or not; and performing a read operation on the monitoring cell again by changing a voltage of a word line adjacent to the monitoring word line when data stored in the monitoring cell is not normally readout.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like numbers refer to like elements throughout.

Figure 1:
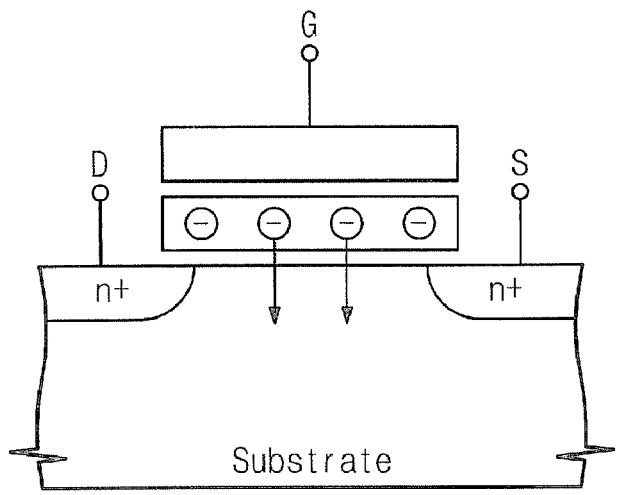
FIG. 1 is a cross section view illustrating a memory cell of a flash memory device.

FIG. 1 is a cross section view illustrating a memory cell of a flash memory device. Referring to FIG. 1, a source (S) and a drain (D) are formed in a semiconductor substrate of both sides of a channel region. A floating gate is formed on the channel region and an insulating layer is disposed between the channel region and the floating gate. A control gate is formed on the floating gate and an insulating layer is disposed between the floating gate and the control gate. Terminals for applying voltages for a program operation, an erasing operation and a read operation are connected to the source (S), the drain (D), the floating gate, the control gate and the semiconductor substrate.

Figure 2A:
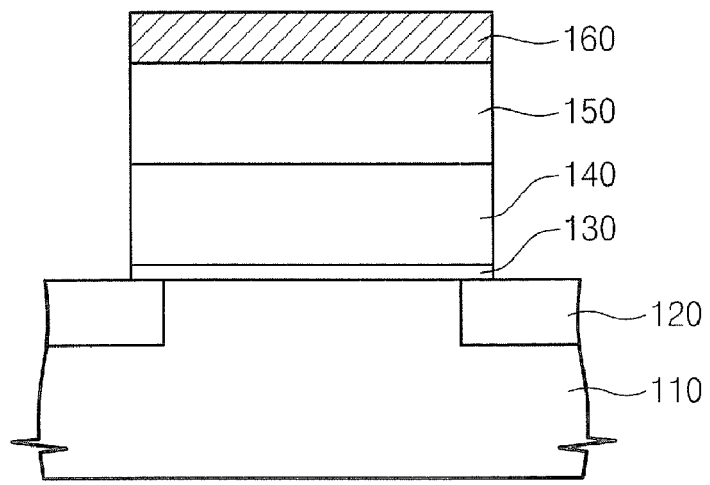
FIG. 2A and FIG. 2B are cross section views illustrating a charge trap flash memory device respectively.
Figure 2B:
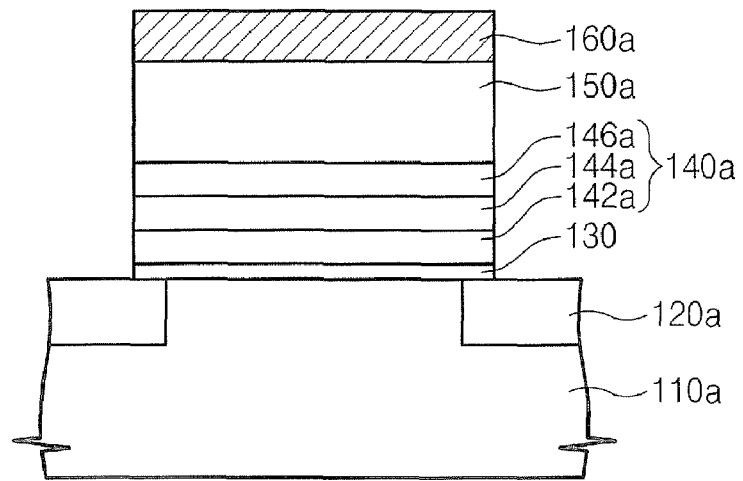

FIG. 2A and FIG. 2B are cross section views illustrating a charge trap flash memory device. Referring to FIG. 2A, a tunnel oxide layer 130, a charge trap layer 140, a blocking insulating layer 150 and a gate electrode 160 are sequentially formed on a substrate 110 including a source/drain region 120. The charge trap layer 140 is formed of nitride silicon, the blocking insulating layer 150 is formed of oxide aluminum and the gate electrode 160 is formed of nitride tantalum. A charge trap flash memory device having this structure is a kind of MONOS, especially is referred to as Thallium-Aluminum oxide-Nitride-Oxide-Semiconductor (TANOS).

Referring to FIG. 2B, a tunnel oxide layer 130a, a charge trap layer 140a, a blocking insulating layer 150a and a gate electrode 160a are sequentially formed on a substrate 110a including a source/drain region 120a. In this case, the charge trap layer 140a is formed of laminated three layers. That is, a first nitride silicon layer 142a, a first oxide aluminum layer 144a and a second nitride silicon layer 46a are sequentially stacked. The blocking insulating layer 150a is formed of oxide aluminum and the gate electrode 160a is formed of nitride tantalum. A charge trap flash memory device having this structure is referred to as Nitride-Aluminumoxide-Nitride (NAN).

In the flash memory device described above, data is decoded by distinction of a threshold voltage of a memory cell. A threshold voltage of a memory cell is determined by the amount of electrons stored in a floating gate or a charge trap layer. As the number of electrons stored in a floating gate or a charge trap layer increases, a threshold voltage becomes high.

Electrons stored in a floating gate may be leaked in the direction of the arrow of FIG. 1 by many causes. Electrons stored in a floating gate or a charge trap layer may be leaked by an external stimulus (e.g., heat). Also, electrons stored in a floating gate or a charge trap layer may be leaked by wear of a memory cell. A repetition of an access operation in a flash memory device wears an insulating layer between a channel region and a floating gate. The access operation includes a program operation, an erasing operation and a read operation. If an insulating layer is worn, charges stored in a floating gate are easily leaked.

Figure 3:
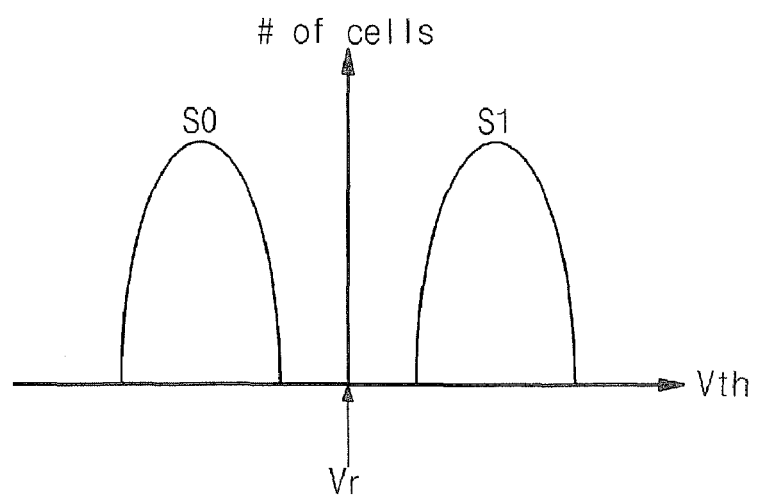
FIG. 3 is a graph illustrating a distribution of a threshold voltage of a memory cell.

FIG. 3 is a graph illustrating a distribution of a threshold voltage of a memory cell. Referring to FIG. 3, a horizontal axis represents a threshold voltage (Vth) and a vertical axis represents the number of memory cells. In a case of a single level cell (SLC), a threshold voltage of a memory cell has one between two states ('S0', 'S1').

When a read voltage (Vr) is applied to a control gate (referring to FIG. 1) of a memory cell, a memory cell of 'S0' state is turned on. In contrast, a memory cell of 'S1' state is turned off. When a memory cell is turned on, a current flows through the memory cell. When a memory cell is turned off, a current does not flow through the memory cell. Thus, data can be distinguished depending on whether a memory cell is turned on or not. A threshold voltage of a memory cell should be uniformly maintained so as to accurately detect data stored in a memory cell. However, as described above, a threshold voltage of a memory cell may be decreased by an external environment and/or wear of a memory cell.

Figure 4:
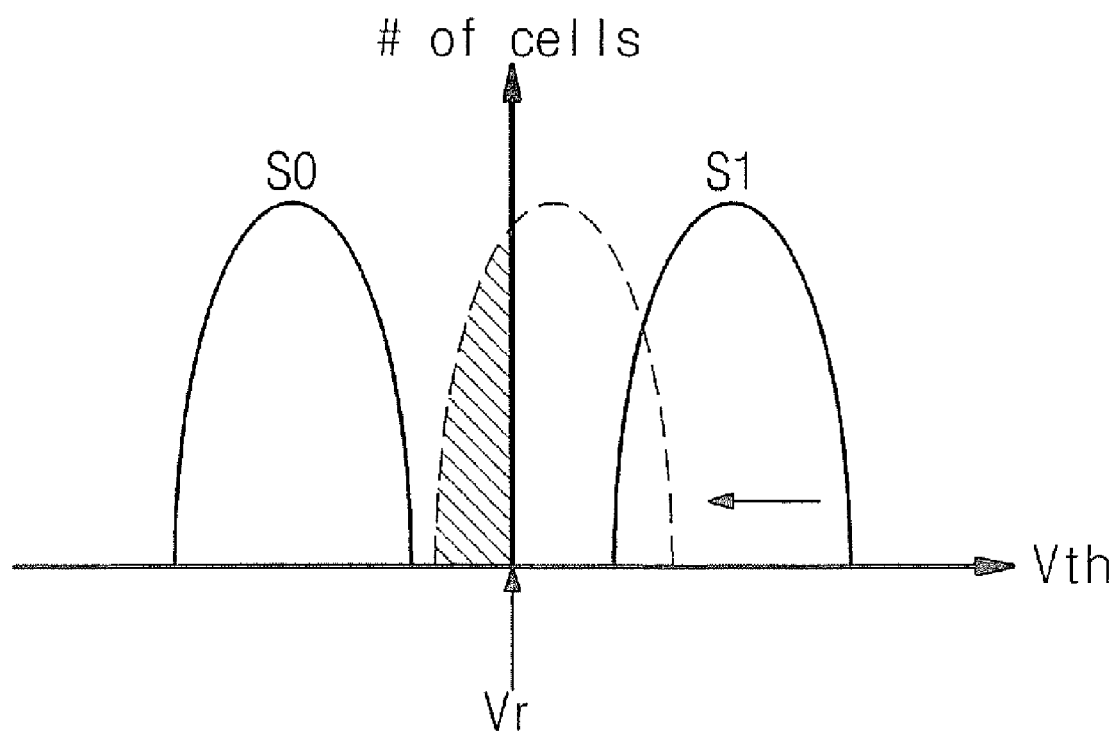
FIG. 4 is a graph illustrating a case that the threshold voltage of the memory cell depicted in FIG. 3 is decreased.

FIG. 4 is a graph illustrating a case that the threshold voltage of the memory cell depicted in FIG. 3 is decreased. Referring to FIG. 4, a solid line represents an initial threshold voltage of a memory cell and a dotted line represents a threshold voltage of a memory cell decreased by an external environment and/or wear of a memory cell. Memory cells which belong to a diagonal portion of FIG. 4 are originally programmed in 'S1' state but they may be judged to be programmed in 'S0' state by a decrease of a threshold voltage. This may cause a read error, thereby degrading reliability of a nonvolatile memory device. A change of a threshold voltage causes problems, especially in a multi level cell (MLC). A plurality of data bits is stored in a multi level cell (MLC) so as to increase an integration of a nonvolatile memory device.

Figure 5:
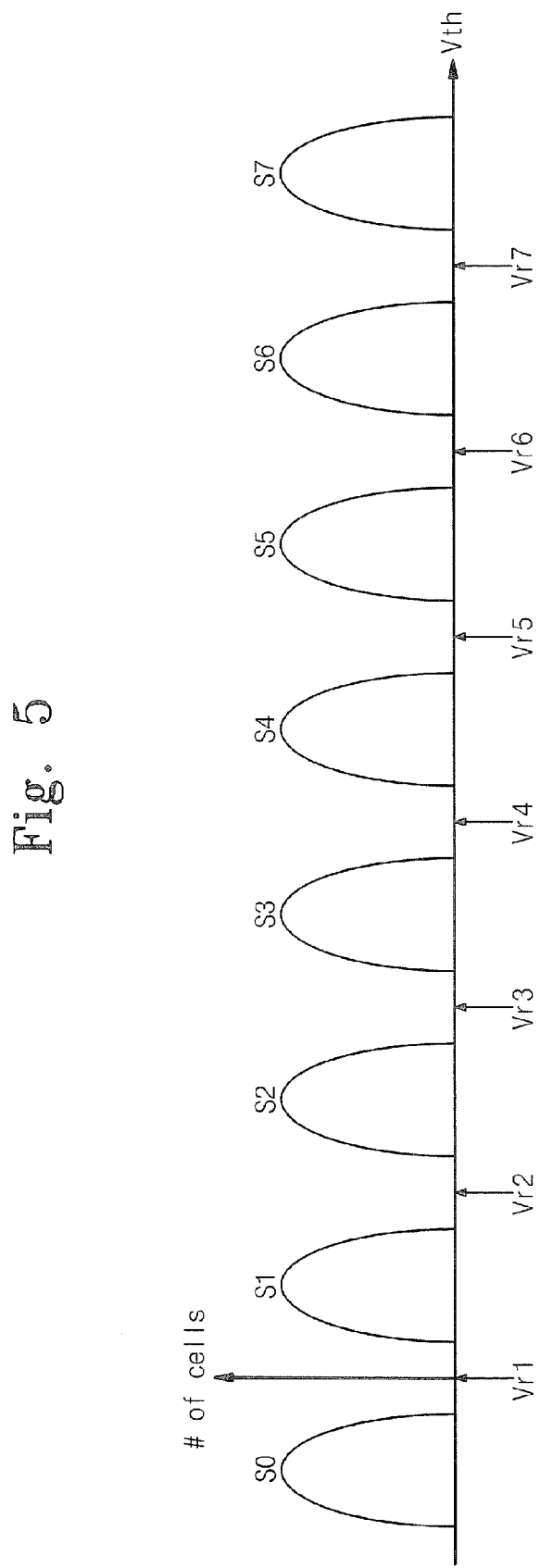
FIG. 5 is a graph illustrating a distribution of a threshold voltage of a three bit multi level cell (MLC).

FIG. 5 is a graph illustrating a distribution of a threshold voltage of a three bit multi level cell (MLC). Referring to FIG. 5, a threshold voltage of the three bit multi level cell (MLC) is one among eight states ('S0'~'S7'). 'S0' represents an erasure state and 'S1'∞'S7' represent a program state. A threshold voltage margin of a multi level cell (MLC) is small as compared with a single level cell (SLC). Accordingly, a small change of a threshold voltage in a multi level cell (MLC) may cause a big problem.

Figure 6:
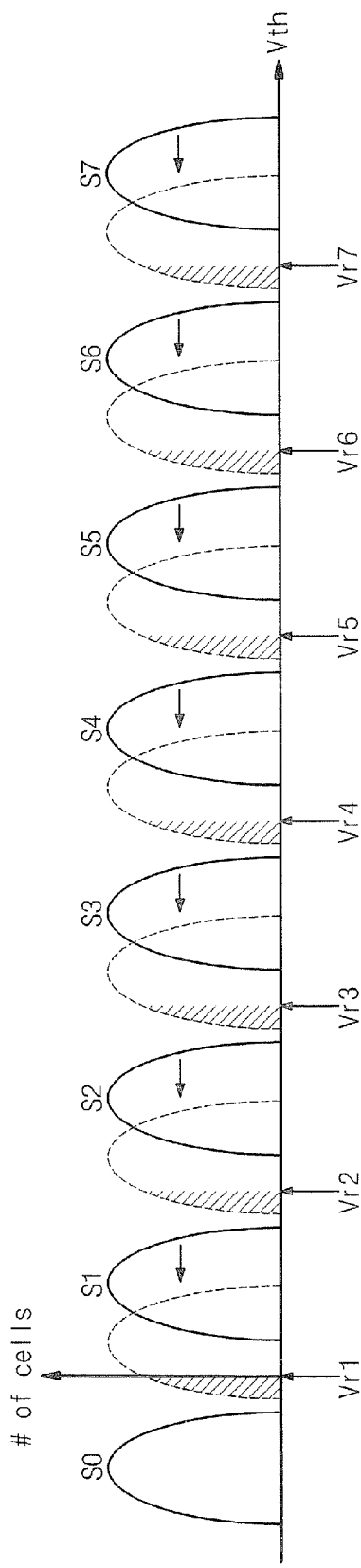
FIG. 6 is a graph illustrating a case that the threshold voltage of the three bit multi level cell (MLC) depicted in FIG. 5 is decreased.

FIG. 6 is a graph illustrating a case that the threshold voltage of the three bit multi level cell (MLC) depicted in FIG. 5 is decreased. Referring to FIG. 6, a solid line represents an initial threshold voltage of a memory cell and a dotted line represents a threshold voltage of a memory cell decreased by an external environment and/or wear of a memory cell. A read error may occur by a decrease of a threshold voltage when reading memory cells corresponding to a diagonal portion.

Figure 7:
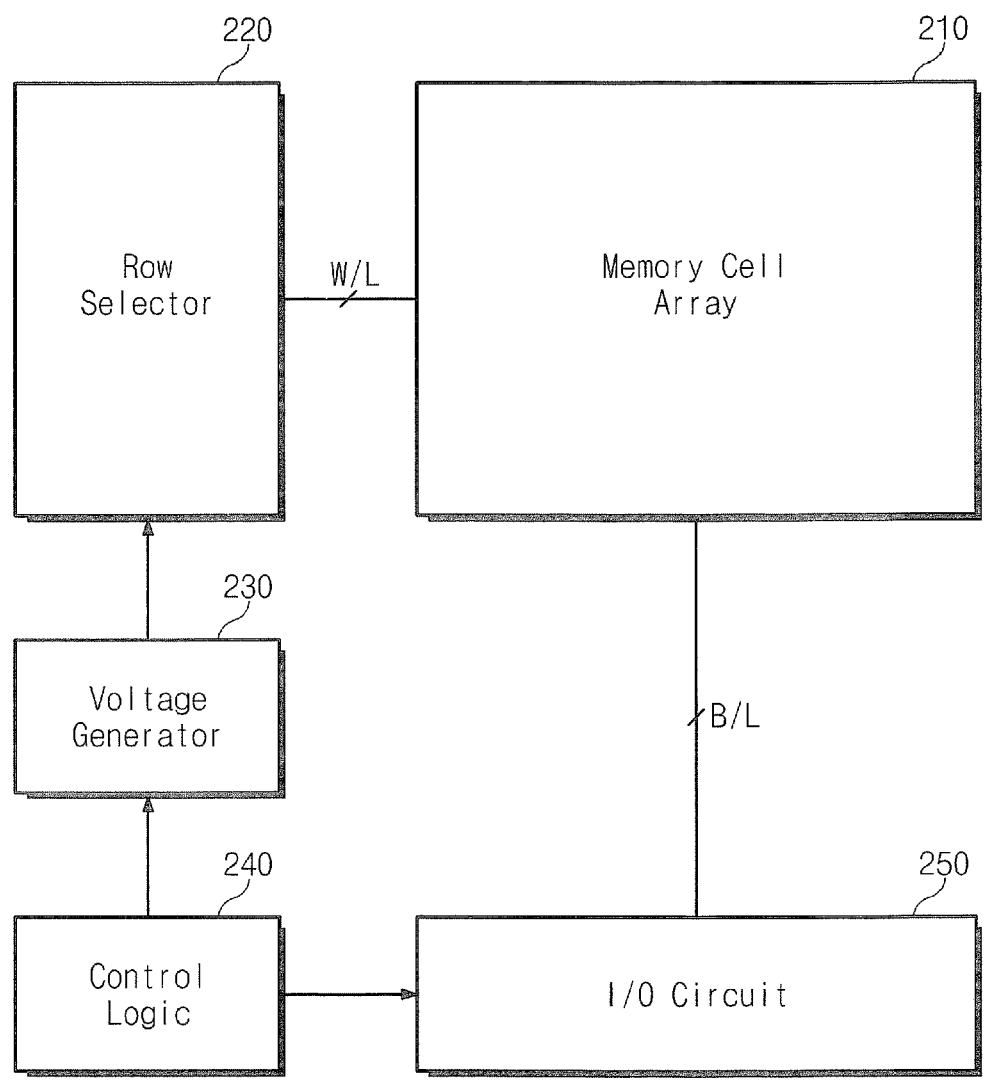
FIG. 7 is a block diagram illustrating a nonvolatile memory device according to the present inventive concept.

FIG. 7 is a block diagram illustrating a nonvolatile memory device according to the present inventive concept. Referring to FIG. 7, a nonvolatile memory device includes a memory cell array 210, a row select circuit 220, an input/output circuit 250, a voltage generator 230 and a control logic circuit 240.

The cell array includes a plurality of memory blocks (not shown). In a flash memory, an erasure operation may be performed on each block. Each block is comprised of memory cells arranged in the form of a matrix of row (or word lines) and columns (or bit lines). Memory cells may be arranged to have a NAND structure or a NOR structure.

The row select circuit 220 drives a selected row and unselected rows respectively in response to a row address (not shown). A drive voltage is generated by the voltage generator 230. When a read operation is performed, the row select circuit 220 applies a read reference voltage to a selected row and a read voltage (Vread) to unselected rows.

The input/output circuit 250 operates as a sense amplifier when a read operation is performed. When a read operation is performed, the input/output circuit 250 readouts data from the memory cell. The control logic circuit 240 controls the voltage generator 230 and the input/output circuit 250 to readout data stored in the memory cell 210.

Figure 8:
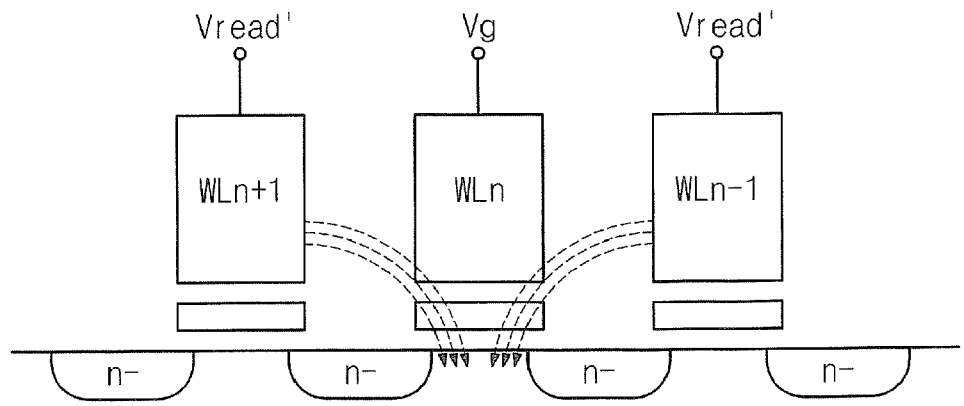
FIG. 8 is a drawing illustrating an effect which a select memory cell receives from an upper word line and a lower word line adjacent to the select memory cell.

FIG. 8 is a drawing illustrating an effect which a select memory cell receives from an upper word line and a lower word line adjacent to the select memory cell. A select memory cell means a memory cell which becomes a target of a read operation. A select word line means a word line to which a select memory cell is connected. In an embodiment according to the present inventive concept, a read voltage applied to an upper word line (WLn+1) and a lower word line (WLn−1) of a select word line (WLn) is controlled by a change of a threshold voltage of a select memory cell.

A channel voltage of a select memory cell connected to a select word line (WLn) may be affected by a voltage of the upper word line (WLn+1) and a voltage of the lower word line (WLn−1). As an integration of a nonvolatile memory device is improved, a degree of interference by a voltage of an adjacent word line becomes great. Also, a channel voltage of a select memory cell is affected not only by a select word line voltage (WLn) but also by an adjacent upper word line voltage (WLn+1) and an adjacent lower word line voltage (WLn−1). This can change a threshold voltage of a select memory cell. For example, when a read operation of a nonvolatile memory device is performed, a select memory cell may be affected by a read voltage (Vread) applied to the upper word line (WLn+1) and the lower word line (WLn−1).

Figure 9:
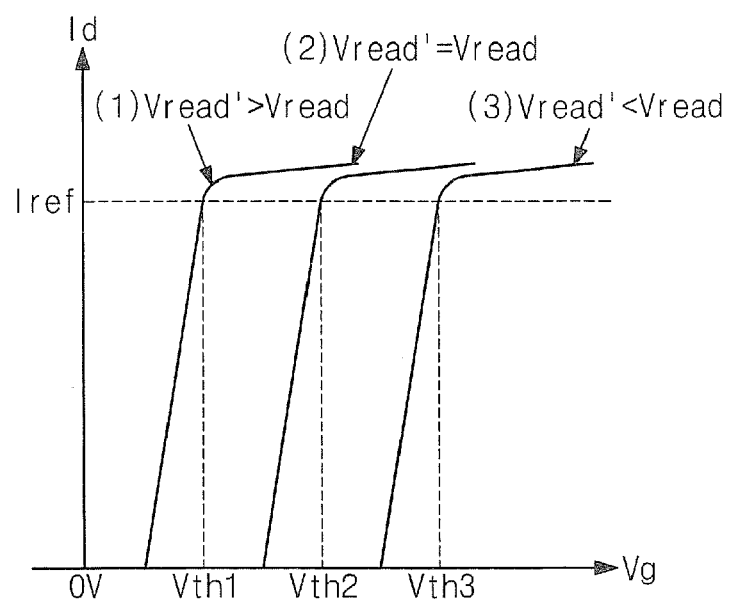
FIG. 9 is a graph illustrating a change of a threshold voltage of a select memory cell according to a read voltage applied to an upper word line and a lower word line when a read operation is performed.

FIG. 9 is a graph illustrating a change of a threshold voltage of a select memory cell according to a read voltage applied to an upper word line and a lower word line when a read operation is performed. Referring to FIG. 9, Vread means a voltage applied to an unselect word line when program verification operation is performed. Memory cells connected to an unselect word line are turned on by a Vread. If a current Iref flows through a memory cell, the memory cell is recognized to be turned on and a gate voltage at this time becomes a threshold voltage.

In the present embodiment, when a read operation is performed, Vread voltage is applied to an upper word line and a lower word line of a select word line. A case of (1) shows a case of applying Vread' higher than Vread to an upper word line and a lower word line of a select word line when a read operation is performed. At this time, the current Iref flows through a select memory cell when a gate voltage of a select memory cell is Vth1. That is, Vth1 becomes a threshold voltage.

A case of (2) shows a case of applying Vread' equal to Vread to an upper word line and a lower word line of a select word line when a read operation is performed. At this time, the current Iref flows through a select memory cell when a gate voltage of a select memory cell is Vth2. That is, Vth2 becomes a threshold voltage.

A case of (3) shows a case of applying Vread' lower than Vread to an upper word line and a lower word line of a select word line when a read operation is performed. At this time, the current Iref flows through a select memory cell when a gate voltage of a select memory cell is Vth3. That is, Vth3 becomes a threshold voltage.

In summary, a threshold voltage of a select memory cell is changed depending on a read voltage (Vread') applied to an upper word line and a lower word line of a select word line when a read operation is performed. Thus, a threshold voltage of a select memory cell can be compensated by controlling a read voltage (Vread') applied to an upper word line and a lower word line of a select word line when a read operation is performed.

Figure 10:
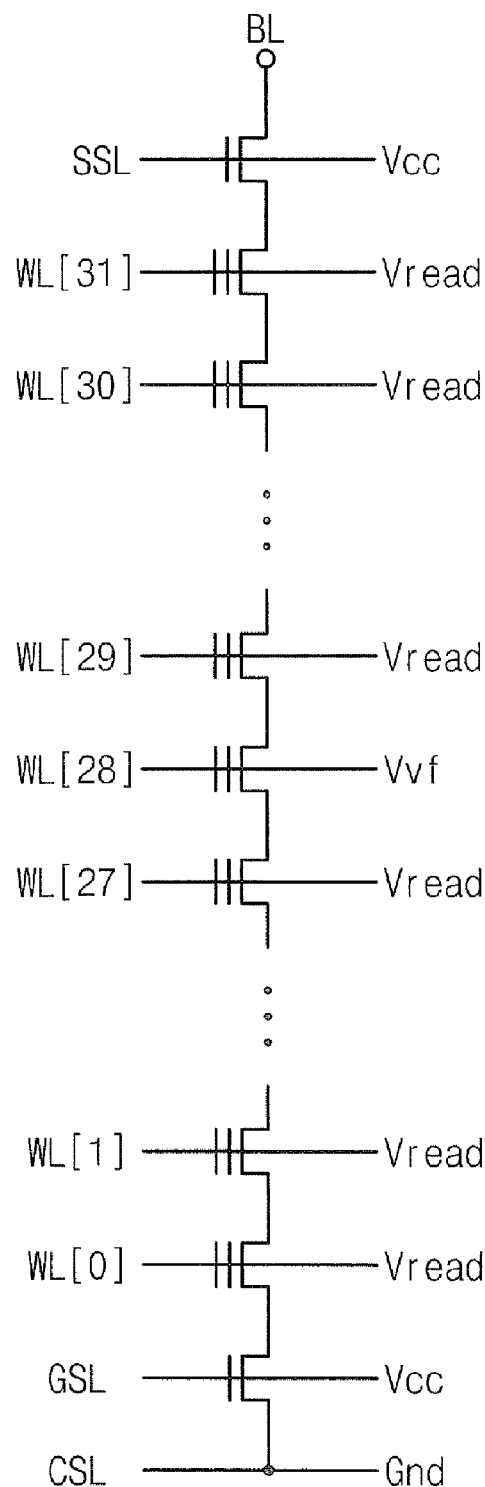
FIG. 10 is a drawing illustrating a bias condition of when verification read operation of a nonvolatile memory device according to the present inventive concept is performed.

FIG. 10 is a drawing illustrating a bias condition of when verification read operation of a nonvolatile memory device according to the present inventive concept is performed. Verification read operation is performed so as to detect whether a memory cell is normally programmed or not. Referring to FIG. 10, for convenience, one memory cell string is depicted. A memory cell array includes a plurality of cell strings. A memory cell string includes a string select transistor connected to a string select line (SSL), a floating gate transistor connected to each of word lines (WL0~WL31) and a ground select transistor connected to a ground select line (GSL).

When verification read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A verification voltage (Vvf) is applied to a select word line. As a verification voltage (Vvf) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

Figure 11:
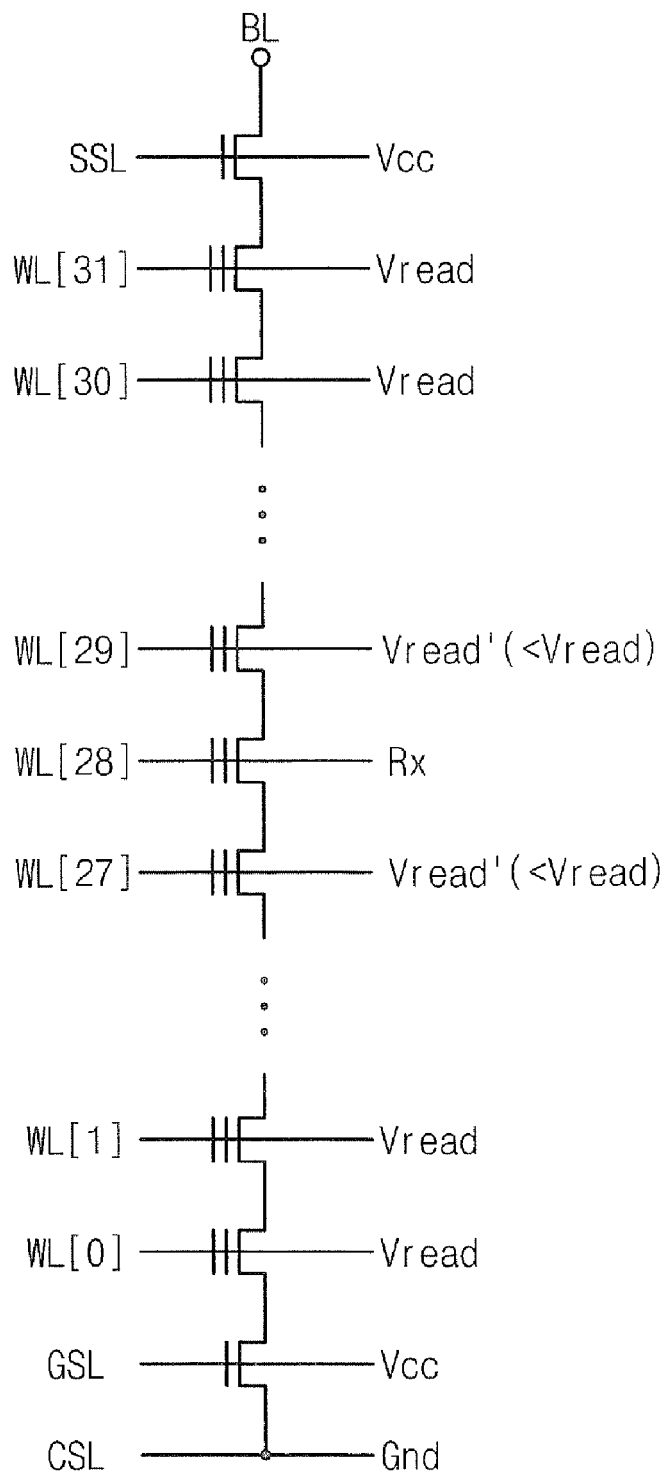
FIG. 11 is a drawing illustrating a bias condition of when a read operation according to a first embodiment of a nonvolatile memory device according to the present inventive concept is performed.

FIG. 11 is a drawing illustrating a bias condition of when a read operation according to a first embodiment of a nonvolatile memory device according to the present inventive concept is performed. Referring to FIG. 11, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' lower than Vread is applied to an upper word line (WL29) and a lower word line (WL27) of the select word line (WL28). A threshold voltage of a select memory cell connected to the select word line (WL28) is increased by interferences of voltages of the upper word line (WL29) and the lower word line (WL27). Thus, a threshold voltage of a select memory cell lowered by a current leakage can be compensated.

Figure 12:
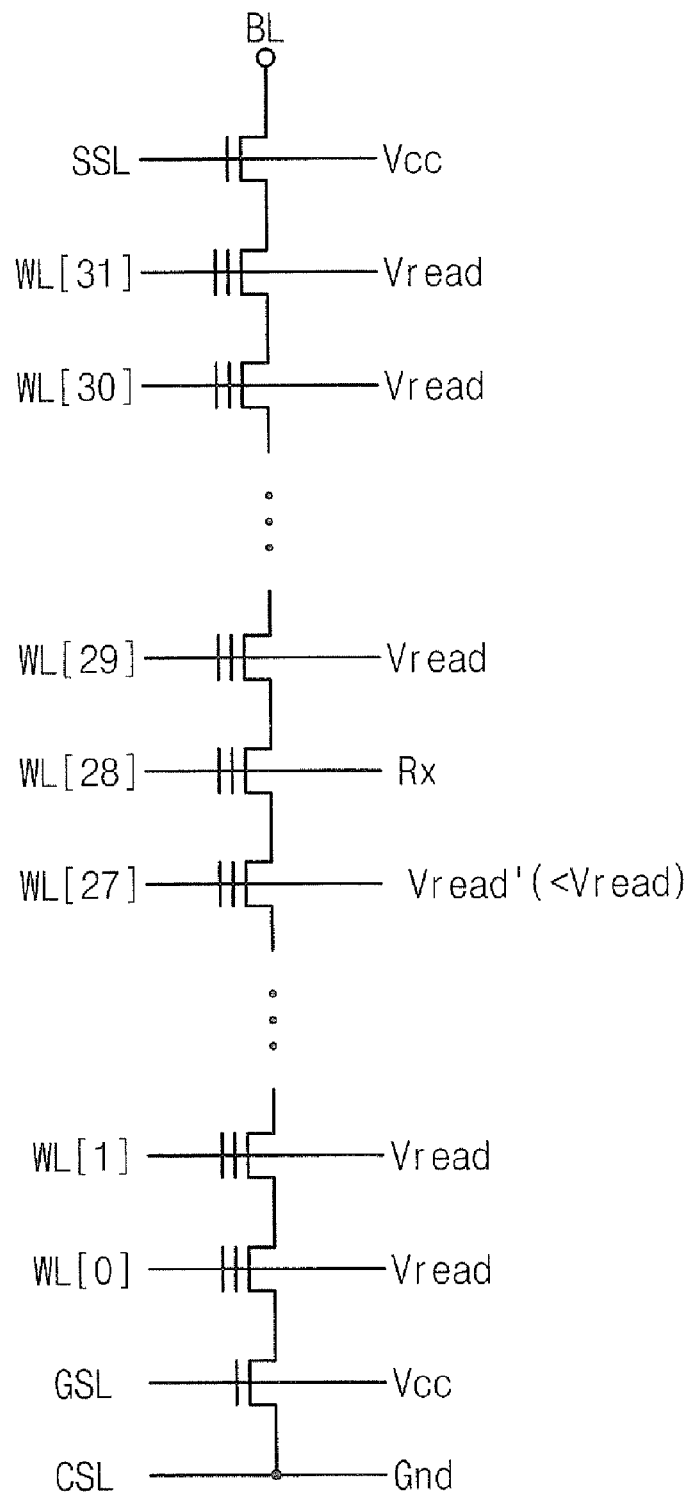
FIG. 12 is a drawing illustrating a bias condition of when a read operation according to a second embodiment of a nonvolatile memory device according to the present inventive concept is performed.

FIG. 12 is a drawing illustrating a bias condition of when a read operation according to a second embodiment of a nonvolatile memory device according to the present inventive concept is performed. Referring to FIG. 12, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' lower than Vread is applied to a lower word line (WL27) of the select word line (WL28). A threshold voltage of a select memory cell connected to the select word line (WL28) is increased by an interference of a voltage of the lower word line (WL27). Thus, a threshold voltage of a select memory cell lowered by a current leakage can be compensated.

Figure 13:
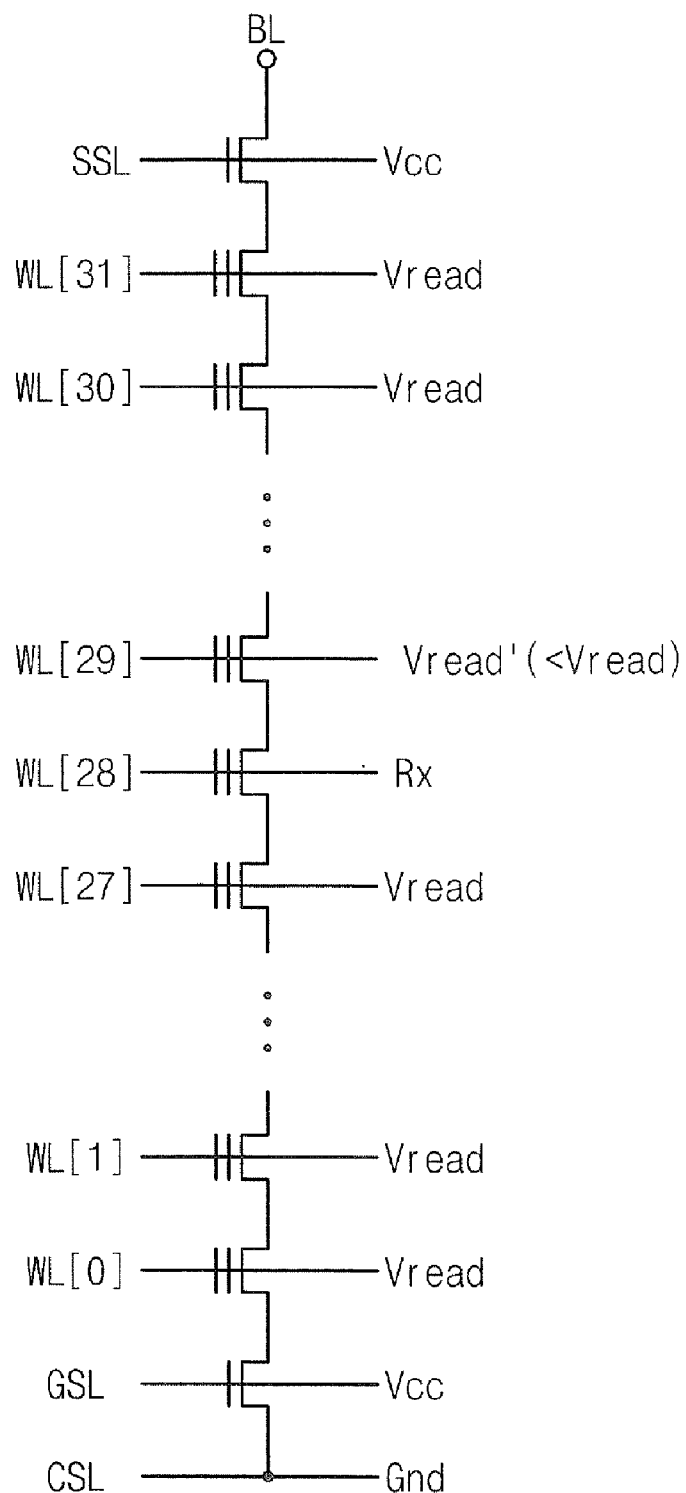
FIG. 13 is a drawing illustrating a bias condition of when a read operation according to a third embodiment of a nonvolatile memory device according to the present inventive concept is performed.

FIG. 13 is a drawing illustrating a bias condition of when a read operation according to a third embodiment of a nonvolatile memory device according to the present inventive concept is performed. Referring to FIG. 13, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' lower than Vread is applied to an upper word line (WL29) of the select word line (WL28). A threshold voltage of a select memory cell connected to the select word line (WL28) is increased by an interference of a voltage of the upper word line (WL29). Thus, a threshold voltage of a select memory cell lowered by a current leakage can be compensated.

Figure 14:
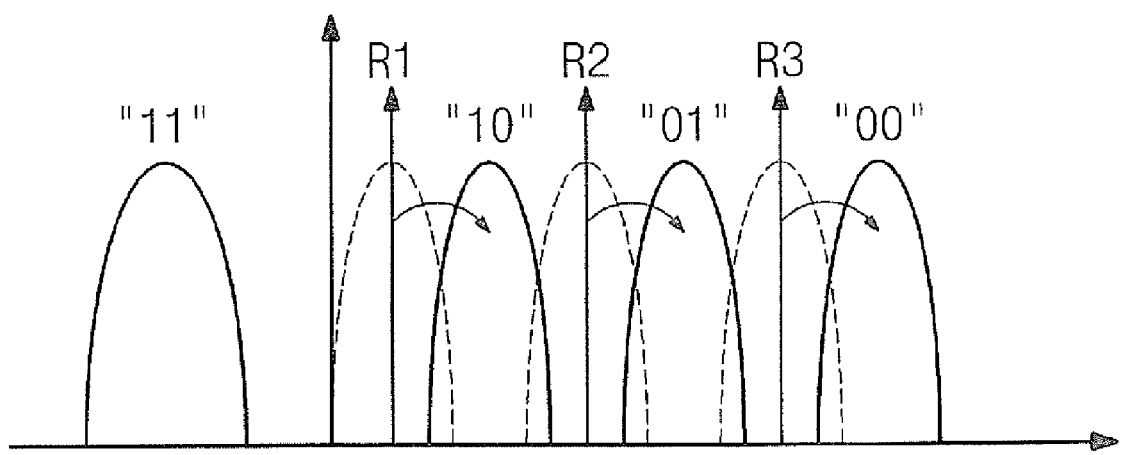
FIG. 14 is a graph illustrating a change of a threshold voltage of a memory cell according to the bias conditions depicted in FIGS. 11 to 13.

FIG. 14 is a graph illustrating a change of a threshold voltage of a memory cell according to the bias conditions depicted in FIGS. 11 to 13. Referring to FIG. 14, a dotted line shows a decrease of a threshold voltage of a memory cell by a leakage current. In an embodiment according to the present inventive concept, a threshold voltage of a memory cell is lowered by applying Vread' lower than a read voltage (Vread) to an upper word line and/or a lower word line of a select word line. Thus, a threshold voltage of a select memory cell lowered by a current leakage can be compensated.

In a case of a conventional nonvolatile memory device, a decreased threshold voltage of a memory cell can be compensated by changing a read reference voltage. In contrast, in the present inventive concept, a read operation can be performed without a change of a read reference voltage by increasing a threshold voltage of a memory cell.

However, a threshold voltage of a memory cell can be increased as the case may be. For example, a threshold voltage of a memory cell can be increased by a coupling due to an adjacent memory cell. An increased threshold voltage of a memory cell may reduce an accuracy of a read operation and may degrade reliability of a nonvolatile memory device. Hereinafter, a read method of when a threshold voltage of a memory cell according to the present inventive concept is increased will be described in detail referring to reference drawings.

Figure 15:
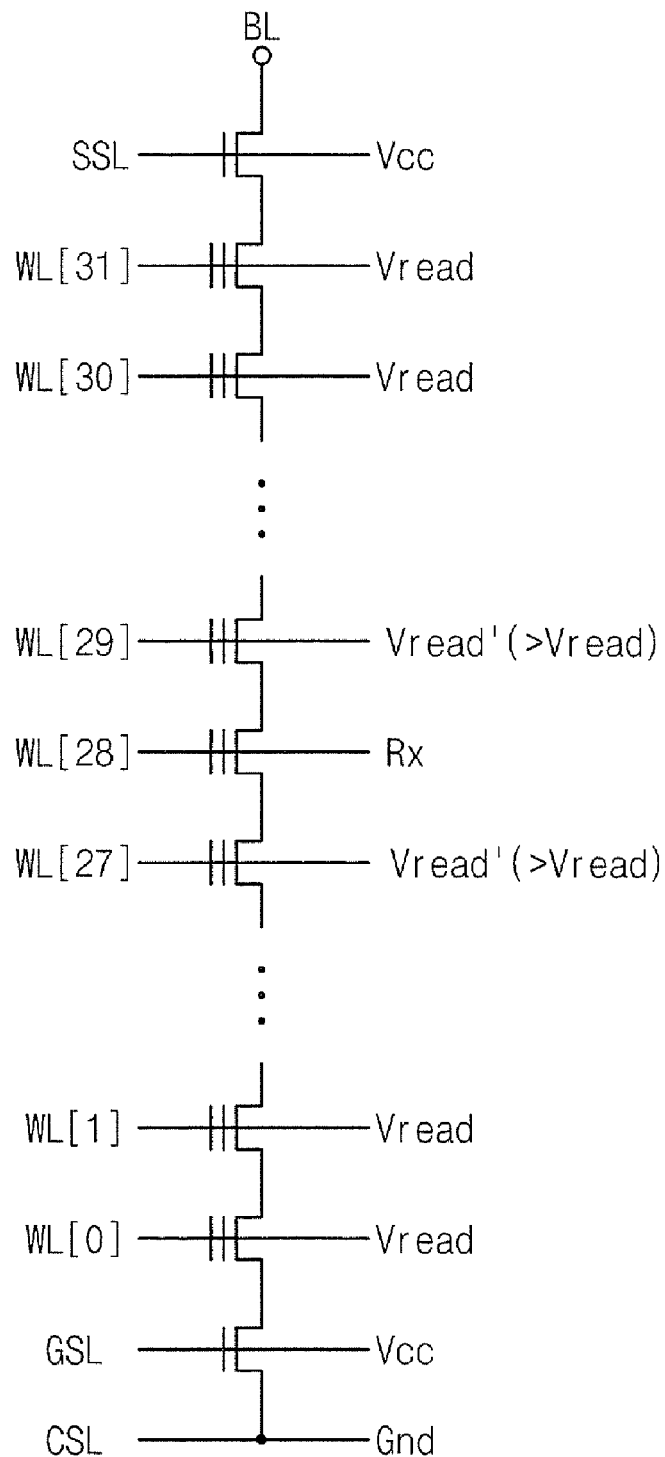
FIG. 15 is a drawing illustrating a bias condition of when a read operation according to a fourth embodiment of a nonvolatile memory device according to the present inventive concept is performed.

FIG. 15 is a drawing illustrating a bias condition of when a read operation according to a fourth embodiment of a nonvolatile memory device according to the present inventive concept is performed. Referring to FIG. 15, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' higher than Vread is applied to an upper word line (WL29) and a lower word line (WL27) of the select word line (WL28). A threshold voltage of a select memory cell connected to the select word line (WL28) is lowered. Thus, a threshold voltage of a select memory cell increased by a coupling can be compensated.

Figure 16:
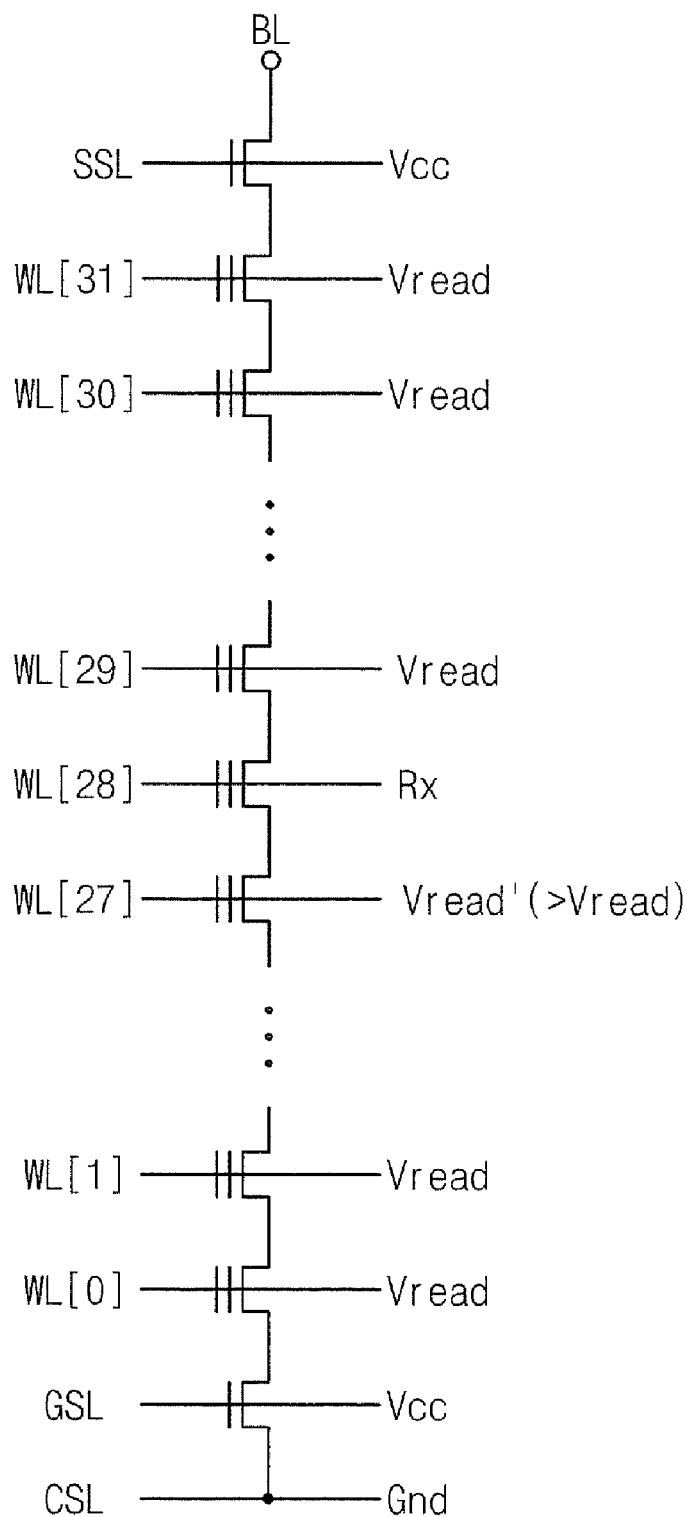
FIG. 16 is a drawing illustrating a bias condition of when a read operation according to a fifth embodiment of a nonvolatile memory device according to the present inventive concept is performed.

FIG. 16 is a drawing illustrating a bias condition of when a read operation according to a fifth embodiment of a nonvolatile memory device according to the present inventive concept is performed. Referring to FIG. 16, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' higher than Vread is applied to a lower word line (WL27) of the select word line (WL28). A threshold voltage of a select memory cell connected to the select word line (WL28) is lowered. Thus, a threshold voltage of a select memory cell increased by a coupling can be compensated.

Figure 17:
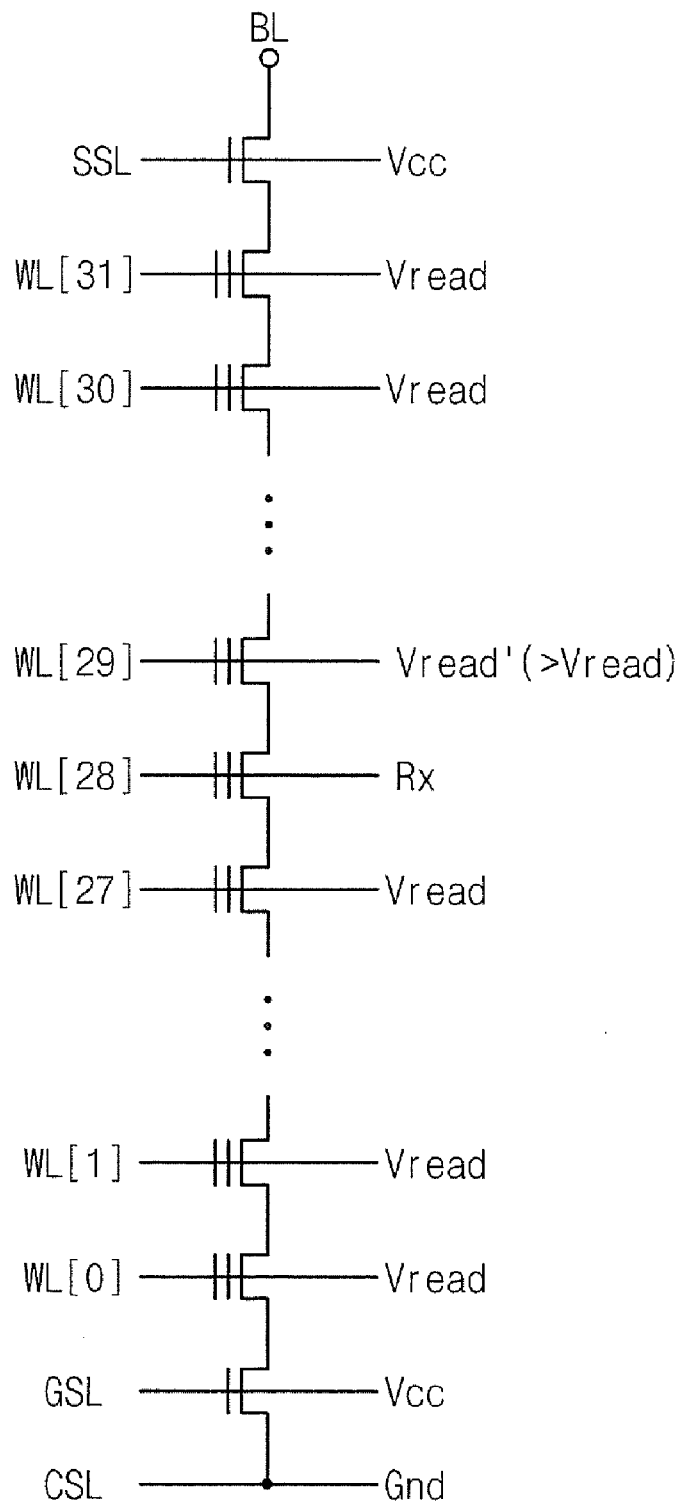
FIG. 17 is a drawing illustrating a bias condition of when a read operation according to a sixth embodiment of a nonvolatile memory device according to the present inventive concept is performed.

FIG. 17 is a drawing illustrating a bias condition of when a read operation according to a sixth embodiment of a nonvolatile memory device according to the present inventive concept is performed. Referring to FIG. 17, when a read operation is performed, a power supply voltage (Vcc) is applied to a string select line (SSL). As a power supply voltage (Vcc) is applied, a string select transistor is turned on. Thus, a memory cell string is connected to a bit line (BL). A read voltage (Vread) is applied to unselect word lines. As a read voltage (Vread) is applied, unselect memory cells connected to unselect word lines are turned on.

A read reference voltage (Rx) is applied to a select word line (WL28). As a read reference voltage (Rx) is applied, a select memory cell is turned on or turned off according to a data state. A select memory cell which is programmed is turned off and a select memory cell which is not programmed is turned on. A power supply voltage (Vcc) is applied to a ground select line (GSL). As a power supply voltage (Vcc) is applied, a ground select transistor is turned on. Thus, a memory cell string is connected to a common source line (CSL).

In an embodiment according to the present inventive concept, Vread' higher than Vread is applied to an upper word line (WL29) of the select word line (WL28). A threshold voltage of a select memory cell connected to the select word line (WL28) is lowered. Thus, a threshold voltage of a select memory cell increased by a coupling can be compensated.

Figure 18:
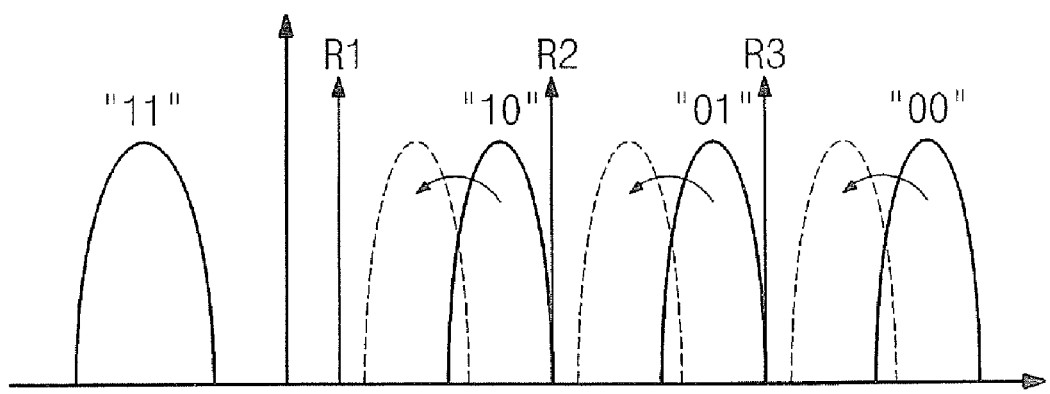
FIG. 18 is a graph illustrating a change of a threshold voltage of a memory cell according to the bias conditions depicted in FIGS. 15 to 17.

FIG. 18 is a graph illustrating a change of a threshold voltage of a memory cell according to the bias conditions depicted in FIGS. 15 to 17. Referring to FIG. 18, a dotted line shows an increase of a threshold voltage of a memory cell by a coupling. In an embodiment according to the present inventive concept, a threshold voltage of a memory cell is lowered by applying Vread' higher than a read voltage (Vread) to an upper word line and/or a lower word line of a select word line. Thus, a threshold voltage of a select memory cell increased by a coupling can be compensated.

In a case of a conventional nonvolatile memory device, an increased threshold voltage of a memory cell can be compensated by changing a read reference voltage. In contrast, in the present inventive concept, a read operation can be performed without a change of a read reference voltage by decreasing a threshold voltage of a memory cell. This simplifies a structure of a nonvolatile memory device.

However, in a flash memory device, a threshold voltage of a memory cell may decrease immediately after a program pass on a memory cell. This phenomenon is caused by a phenomenon that after a charge is trapped in a moment by a program of a memory cell, a charge is detrapped in a moment again. Thus, when a read operation is performed immediately after finishing a program and a program verification operation of a memory cell, a problem that a memory cell may be judged not to be programmed may occur.

The problem described above may be removed by a seventh embodiment according to the present inventive concept. When a read operation is performed, Vread' lower than Vread that is applied when a program verification operation is performed is applied to an upper word line and a lower word line. The amount of an initial decrease of a threshold voltage can be obtained as a type of a statistical data. Thus, referring to a statistical data, the amount of an initial decrease of a threshold voltage according to the number of a program repetition is determined in advanced and Vread' according to the amount of an initial decrease may be applied. A statistical data may be stored inside or outside of a nonvolatile memory device.

Figure 19:
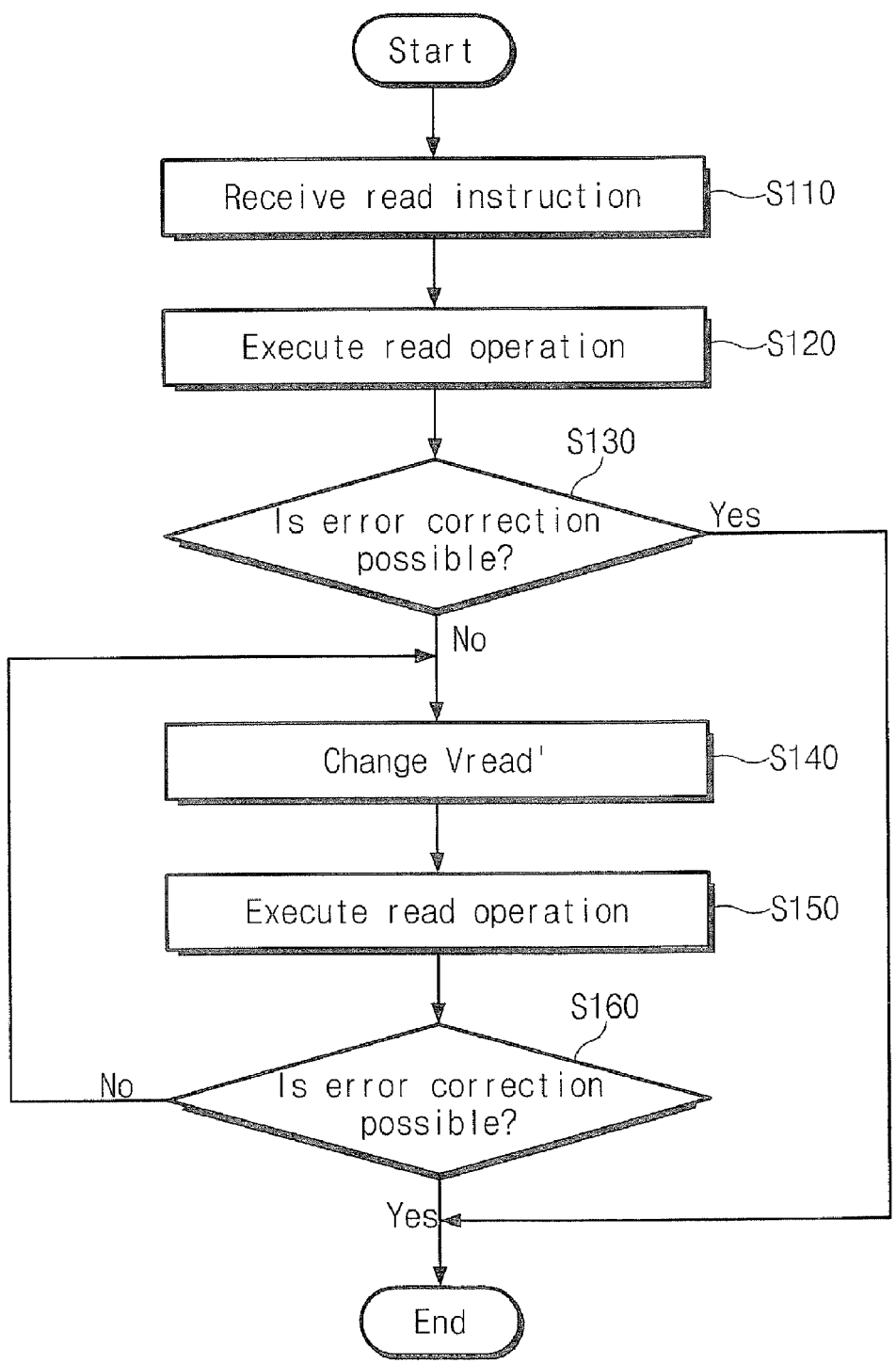
FIG. 19 is a flow chart illustrating a read method according to an eighth embodiment of a nonvolatile memory device according to the present inventive concept.

FIG. 19 is a flow chart illustrating a read method according to an eighth embodiment of a nonvolatile memory device according to the present inventive concept. Referring to FIG. 19, a read method of a nonvolatile memory device according to the present inventive concept includes a step of a read operation performance, an error detection step and a step of a changing a read voltage.

In S110 step, a nonvolatile memory device receives a read instruction from external device. For example, a nonvolatile memory device may receive a read instruction from a memory controller. In S120 step, a nonvolatile memory device performs a read operation in response to a read instruction. A read operation is performed using a well known bias condition. In S130 step, an error occurs during a read operation and if an error occurred can not be corrected, S140 step is performed. In contrast, if an error does not occur or an error occurred can be corrected, a read operation is over.

In S140 step, a read voltage (Vread') applied to an upper word line and a lower word line of a select word line is changed. For example, when a threshold voltage of a memory cell decreases, a read voltage (Vread') is decreased and when a threshold voltage of a memory cell increases, a read voltage (Vread') is increased. A changed read voltage (Vread') is stored in a nonvolatile memory controller, a volatile memory controller and a flash memory controller and can be used during a next read operation. In S150 step, a read operation is performed again by applying a changed read voltage (Vread') to an upper word line and a lower word line. In S160 step, an error occurs during a read operation and if an error occurred can not be corrected, S140 step is performed again. In contrast, if an error does not occur or an error occurred can be corrected, a read operation is over.

In an embodiment according to the present inventive concept, a level of a read voltage (Vread') is changed according to whether an error occurred during a read operation can be corrected or not. A reduction of a memory cell or an increased threshold voltage can be compensated by changing a read voltage (Vread').

Figure 20:
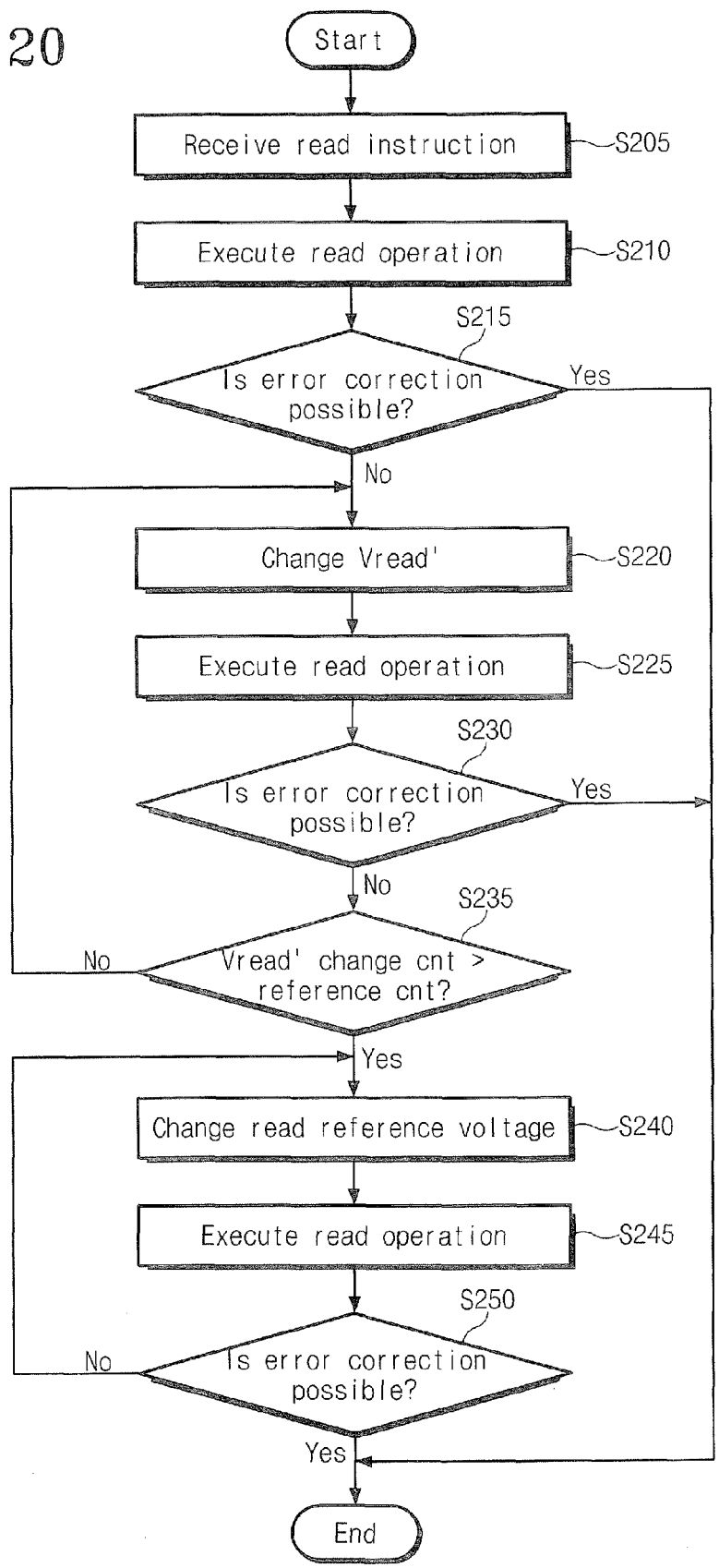
FIG. 20 is a flow chart illustrating a read method according to a ninth embodiment of a nonvolatile memory device according to the present inventive concept.

FIG. 20 is a flow chart illustrating a read method according to a ninth embodiment of a nonvolatile memory device according to the present inventive concept. Referring to FIG. 20, a read method of a nonvolatile memory device according to the present inventive concept includes a step of a read operation performance, an error detection step, a step of a changing a read voltage and a step of changing a read reference voltage.

In S205 step, a nonvolatile memory device receives a read instruction from external device. In S210 step, a nonvolatile memory device performs a read operation in response to a read instruction. A read operation is performed using a well known bias condition. In S215 step, an error occurs during a read operation and if an error occurred can not be corrected, S220 step is performed. In contrast, if an error does not occur or an error occurred can be corrected, a read operation is over.

In S220 step, a read voltage (Vread') applied to an upper word line and a lower word line of a select word line is changed. For example, when a threshold voltage of a nonvolatile memory cell decreases, a read voltage (Vread') is decreased and when a threshold voltage of a nonvolatile memory cell increases, a read voltage (Vread') is increased. A changed read voltage (Vread') is stored in a nonvolatile memory controller, a volatile memory controller and a flash memory controller and can be used during a next read operation. In S225 step, a read operation is performed by applying a changed read voltage (Vread') to an upper word line and a lower word line. In S230 step, an error occurs during a read operation and if an error occurred can not be corrected, S235 step is performed again. In contrast, if an error does not occur or an error occurred can be corrected, a read operation is over.

In S235 step, whether the number of changing a read voltage exceeds the reference count or not is detected. If the number of changing a read voltage does not exceed the reference count, S220 step is performed again. If the number of changing a read voltage exceeds the reference count, S240 step is performed. In S240 step, a read reference voltage is changed. For example, when a threshold voltage of a nonvolatile memory cell decreases, a read reference voltage (Vread') is decreased and when a threshold voltage of a nonvolatile memory cell increases, a read reference voltage (Vread') is increased. A changed reference read voltage (Vread') is stored in a nonvolatile memory controller, a volatile memory controller and a flash memory controller and can be used during a next read operation. In S245 step, a read operation is performed again by applying a changed read reference voltage (Vread') to a select word line. In S250 step, an error occurs during a read operation and if an error occurred can not be corrected, S240 step is performed again. In contrast, if an error does not occur or an error occurred can be corrected, a read operation is over.

In an embodiment according to the present inventive concept, a level of a read voltage (Vread') is changed according to whether an error occurred during a read operation can be corrected or not. A reduction of a memory cell or an increased threshold voltage can be compensated by changing a read voltage (Vread'). Also, if the number of changing a read voltage (Vread') exceeds the reference count, data stored in a memory cell can be accurately readout by changing a read reference voltage.

Figure 21:
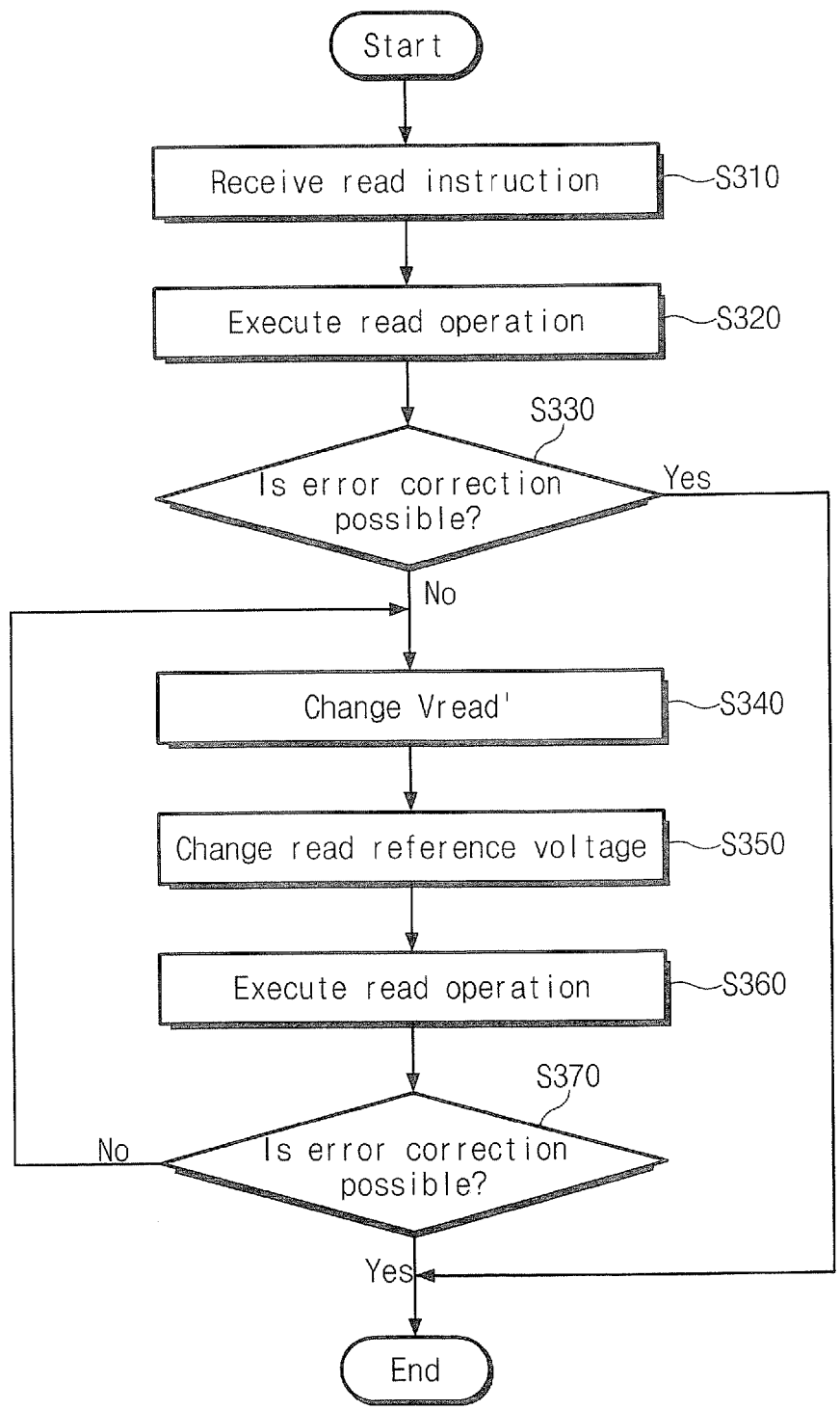
FIG. 21 is a flow chart illustrating a read method according to a tenth embodiment of a nonvolatile memory device according to the present inventive concept.

FIG. 21 is a flow chart illustrating a read method according to a tenth embodiment of a nonvolatile memory device according to the present inventive concept. Referring to FIG. 21, a read method of a nonvolatile memory device according to the present inventive concept includes a step of a read operation performance, an error detection step, a step of a changing a read voltage and a step of changing a read reference voltage.

In S310 step, a nonvolatile memory device receives a read instruction from external device. In S320 step, a nonvolatile memory device performs a read operation in response to a read instruction. A read operation is performed using a well known bias condition. In S330 step, an error occurs during a read operation and if an error occurred can not be corrected, S340 step is performed. In contrast, if an error does not occur or an error occurred can be corrected, a read operation is over.

In S340 step, a read voltage (Vread') applied to an upper word line and a lower word line of a select word line is changed. For example, when a threshold voltage of a nonvolatile memory cell decreases, a read voltage (Vread') is decreased and when a threshold voltage of a nonvolatile memory cell increases, a read voltage (Vread') is increased. A changed read voltage (Vread') is stored in a nonvolatile memory controller, a volatile memory controller and a flash memory controller and can be used during a next read operation.

In S350 step, a read reference voltage applied to a select word line is changed. For example, when a threshold voltage of a nonvolatile memory cell decreases, a read voltage (Vread') is decreased and when a threshold voltage of a nonvolatile memory cell increases, a read voltage (Vread') is increased. A changed read reference voltage (Vread') is stored in a nonvolatile memory controller, a volatile memory controller and a flash memory controller and can be used during a next read operation.

In S360 step, a read operation is performed using a changed read voltage (Vread') and a read reference voltage. In S370 step, an error occurs during a read operation and if an error occurred can not be corrected, S340 step is performed again. In contrast, if an error does not occur or an error occurred can be corrected, a read operation is over.

In an embodiment according to the present inventive concept, if an error occurred during a read operation can not be corrected, a level of a read voltage (Vread') and a level of a read reference voltage are changed together. A reduction of a memory cell or an increased threshold voltage can be compensated by changing a read voltage (Vread'). Also, data stored in a memory cell can be accurately readout by changing a read reference voltage.

Figure 22:
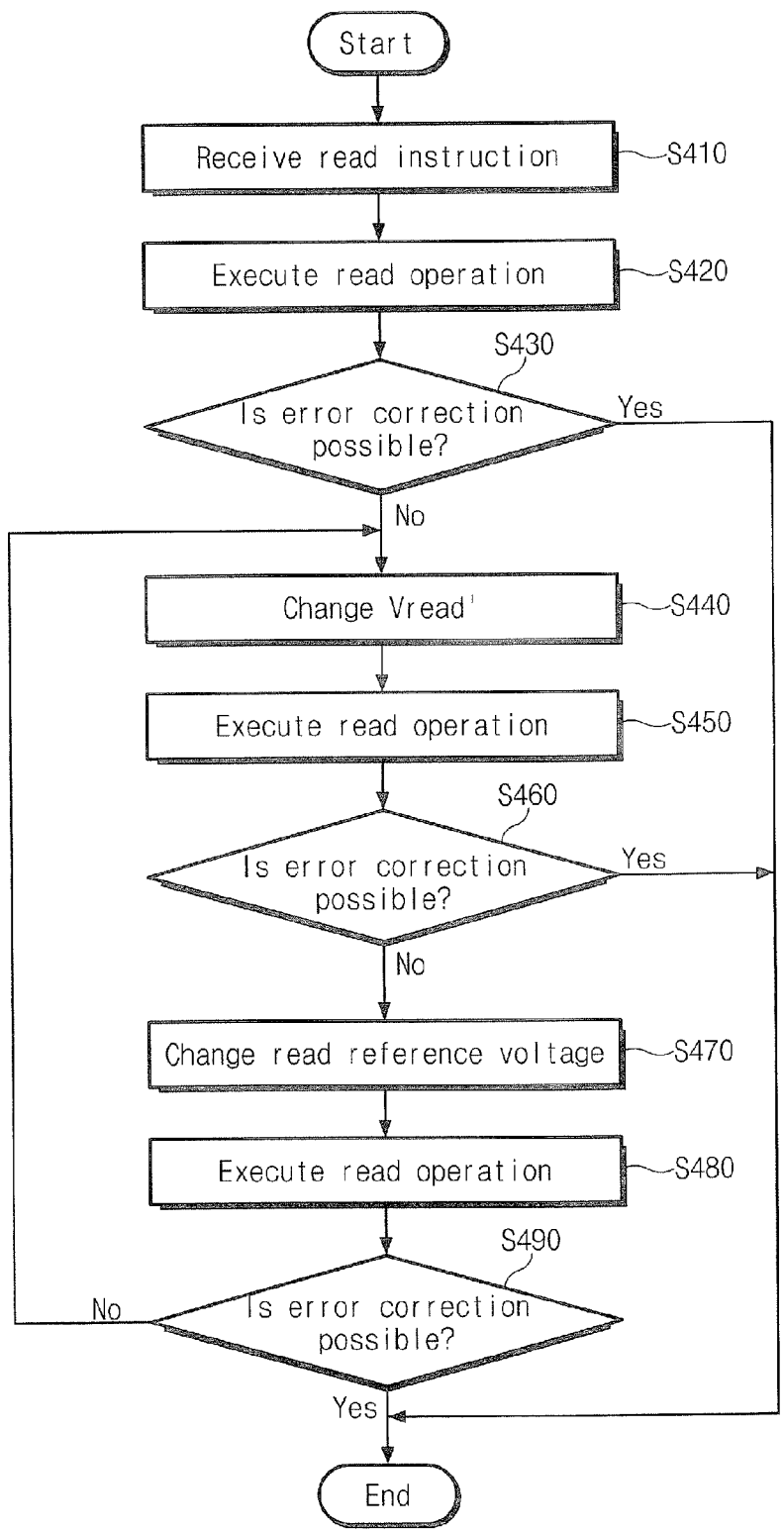
FIG. 22 is a flow chart illustrating a read method according to an eleventh embodiment of a nonvolatile memory device according to the present inventive concept.

FIG. 22 is a flow chart illustrating a read method according to a eleventh embodiment of a nonvolatile memory device according to the present inventive concept. Referring to FIG. 22, a read method of a nonvolatile memory device according to the present inventive concept includes a step of a read operation performance, an error detection step, a step of a changing a read voltage and a step of changing a read reference voltage.

In 4310 step, a nonvolatile memory device receives a read instruction from external device. In S420 step, a nonvolatile memory device performs a read operation in response to a read instruction. A read operation is performed using a well known bias condition. In S430 step, an error occurs during a read operation and if an error occurred can not be corrected, S440 step is performed. In contrast, if an error does not occur or an error occurred can be corrected, a read operation is over.

In S440 step, a read voltage (Vread') applied to an upper word line and a lower word line of a select word line is changed. For example, when a threshold voltage of a nonvolatile memory cell decreases, a read voltage (Vread') is decreased and when a threshold voltage of a nonvolatile memory cell increases, a read voltage (Vread') is increased. A changed read voltage (Vread') is stored in a nonvolatile memory controller, a volatile memory controller and a flash memory controller and can be used during a next read operation.

In S450 step, a read operation is performed using a changed read voltage (Vread'). In S460, an error occurs during a read operation and if an error occurred can not be corrected, S470 step is performed. In contrast, if an error does not occur or an error occurred can be corrected, a read operation is over.

In S470 step, a read reference voltage applied to a select word line is changed. For example, when a threshold voltage of a nonvolatile memory cell decreases, a read voltage (Vread') is decreased and when a threshold voltage of a nonvolatile memory cell increases, a read voltage (Vread') is increased. A changed read reference voltage (Vread') is stored in a nonvolatile memory controller, a volatile memory controller and a flash memory controller and can be used during a next read operation.

In S480 step, a read operation is performed using a changed read voltage (Vread') and a read reference voltage. In S490 step, an error occurs during a read operation and if an error occurred can not be corrected, S440 step is performed again. In contrast, if an error does not occur or an error occurred can be corrected, a read operation is over. In the present embodiment, a read voltage (Vread') may be changed after a read reference voltage is changed or a read reference voltage may be changed after a read voltage (Vread') is changed.

In an embodiment according to the present inventive concept, if an error occurred during a read operation can not be corrected, a level of a read voltage (Vread') is changed. A reduction of a memory cell or an increased threshold voltage can be compensated by changing a read voltage (Vread'). Also, when an error occurs even by a change of a read voltage (Vread'), a read reference voltage is changed. Data stored in a memory cell can be accurately readout by changing a read reference voltage.

Figure 23:
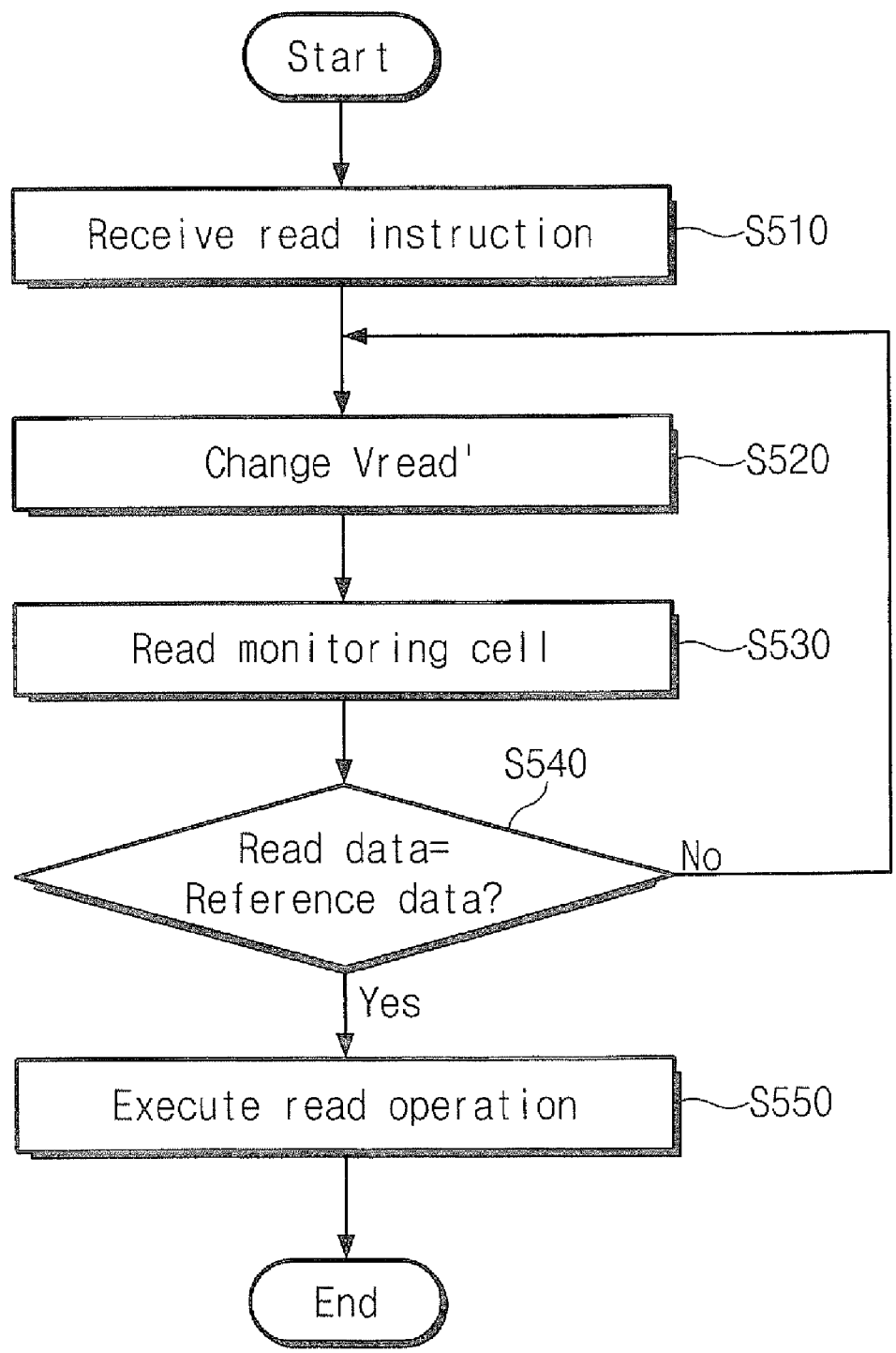
FIG. 23 is a flow chart illustrating a read method according to a twelfth embodiment of a nonvolatile memory device according to the present inventive concept.

FIG. 23 is a flow chart illustrating a read method according to a twelfth embodiment of a nonvolatile memory device according to the present inventive concept. In the present embodiment, a nonvolatile memory device further includes a monitoring cell. The monitoring cell is disposed in the memory cell array and has the same structure as the memory cell. Thus, a characteristic of a memory cell can be estimated by detecting the monitoring cell. An initial data stored in the monitoring cell is known.

Referring to FIG. 23, a read method of a nonvolatile memory device according to the present inventive concept includes a step of reading a monitoring cell, an error detection step and a step of a changing a read voltage. In S510 step, a nonvolatile memory device receives a read instruction from an external device. In S520 step, a nonvolatile memory device changes a read voltage (Vread') applied to an upper word line and a lower word line of a select word line. In S530 step, a read operation is performed on the monitoring cell. In S540 step, data read from the monitoring cell and a reference data are compared with each other. If the data read from the monitoring cell is different from the reference data, the S520 step is performed again. If the data read from the monitoring cell is the same as the reference data, a read operation is performed on a memory cell.

In an embodiment according to the present inventive concept, data stored in the monitoring cell is read using a predetermined read voltage (Vread'). If data stored in the monitoring cell is accurately read, it means that a read voltage (Vread') is proper. Thus, a read operation is performed on a memory cell using a read voltage (Vread'). In contrast, if data stored in the monitoring cell is not accurately read, it means that a read voltage (Vread') is not proper. Thus, a read voltage (Vread') is changed. A reduction of a memory cell or an increased threshold voltage can be compensated by changing a read voltage (Vread').

Figure 24:
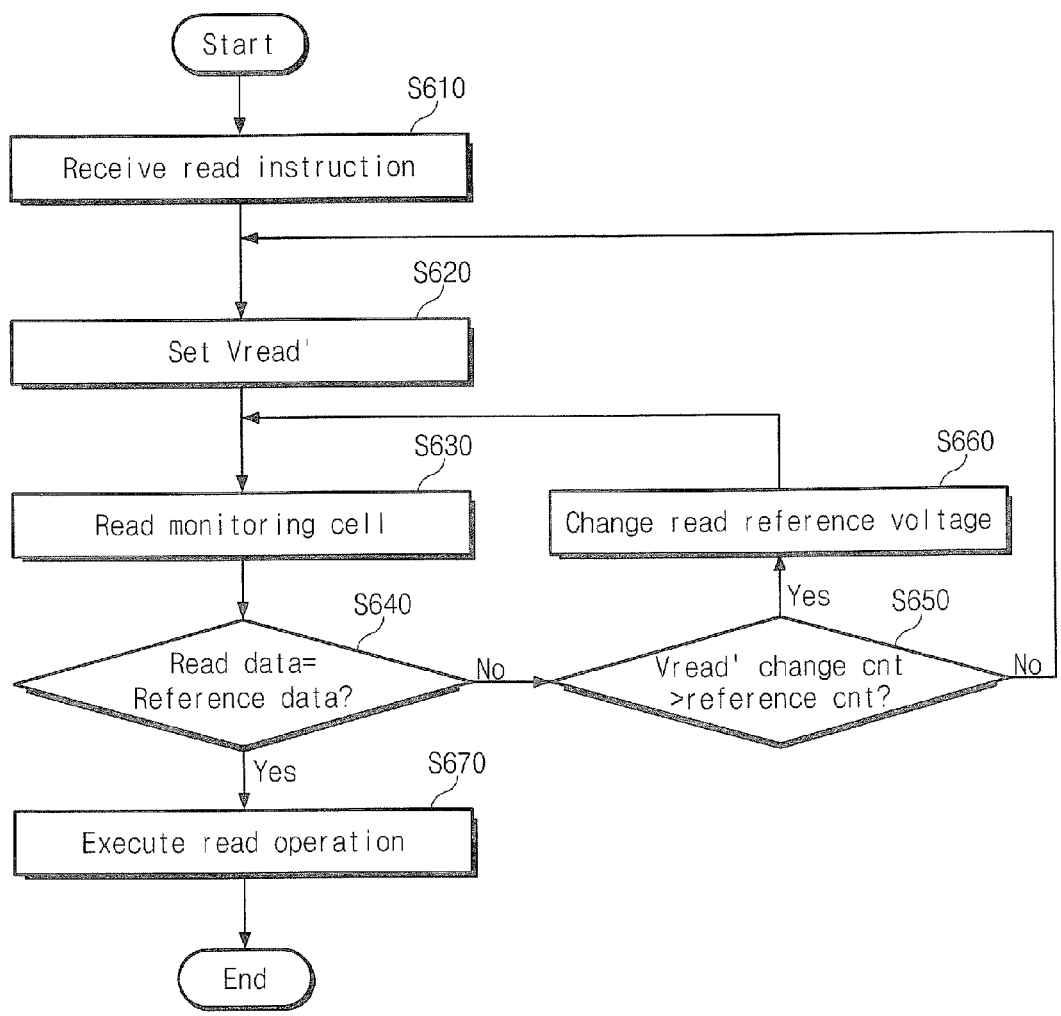
FIG. 24 is a flow chart illustrating a read method according to a thirteenth embodiment of a nonvolatile memory device according to the present inventive concept.

FIG. 24 is a flow chart illustrating a read method according to a thirteenth embodiment of a nonvolatile memory device according to the present inventive concept. In the present embodiment, a nonvolatile memory device further includes a monitoring cell. The monitoring cell is disposed in the memory cell array and has the same structure as the memory cell. Thus, a characteristic of a memory cell can be estimated by detecting the monitoring cell. An initial data stored in the monitoring cell is known.

Referring to FIG. 24, a read method of a nonvolatile memory device according to the present inventive concept includes a step of reading a monitoring cell, an error detection step, a step of a changing a read voltage and a step of changing a read reference voltage. In S610 step, a nonvolatile memory device receives a read instruction from an external device. In S620 step, a nonvolatile memory device changes a read voltage (Vread') applied to an upper word line and a lower word line of a select word line. In S630 step, a read operation is performed on the monitoring cell. In S640 step, data read from the monitoring cell and a reference data are compared with each other. If the data read from the monitoring cell is different from the reference data, the S520 step is performed again. If the data read from the monitoring cell is the same as the reference data, a read operation is performed on a memory cell.

In S650 step, whether the number of changing a read voltage exceeds the reference count or not is detected. If the number of changing a read voltage does not exceed the reference count, S620 step is performed again. If the number of changing a read voltage exceeds the reference count, S660 step is performed. In S660 step, a read reference voltage is changed and the S620 step is performed again.

In an embodiment according to the present inventive concept, data stored in the monitoring cell is read using a predetermined read voltage (Vread'). If data stored in the monitoring cell is accurately read, a read operation is performed on a memory cell using the predetermined read voltage (Vread'). In contrast, if data stored in the monitoring cell is not accurately read, a read voltage (Vread') and a read reference voltage are changed. A reduction of a memory cell or an increased threshold voltage can be compensated by changing a read voltage (Vread') and a read reference voltage.

Figure 25:
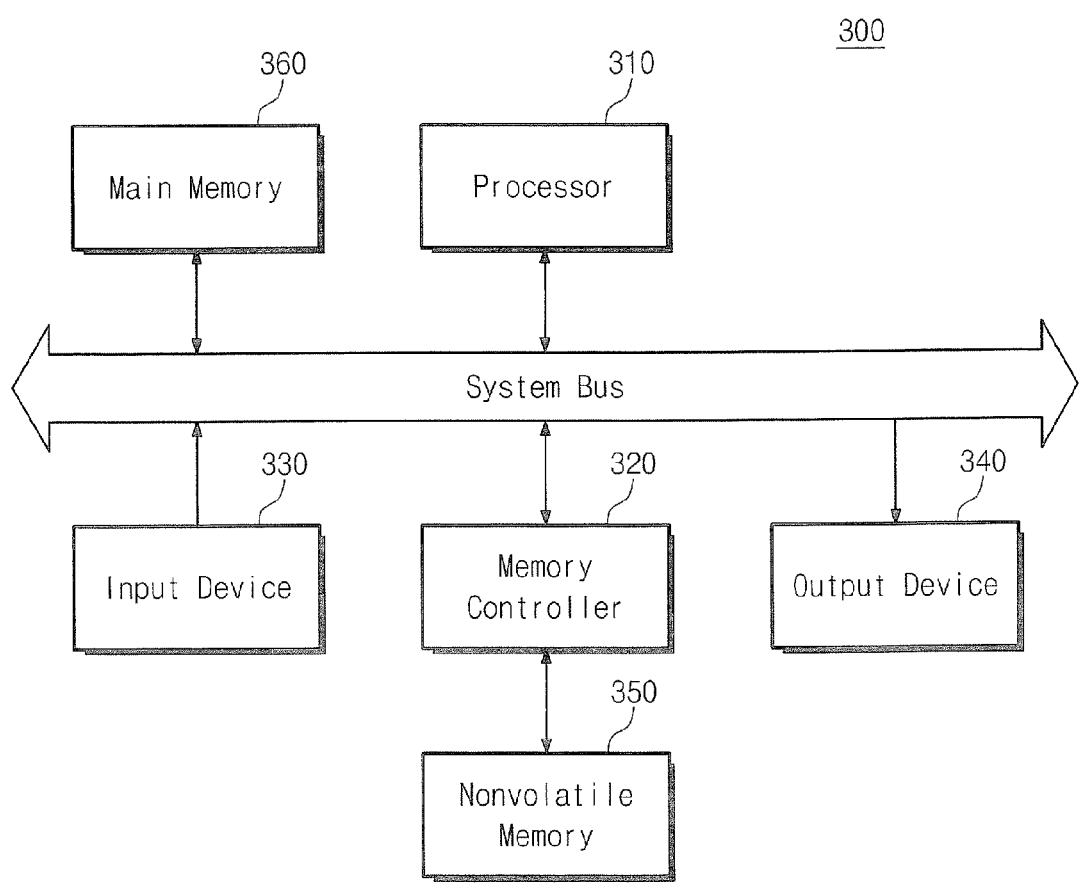
FIG. 25 is a block diagram illustrating a computing system including a flash memory according to the present inventive concept.

FIG. 25 is a block diagram illustrating a computing system including a flash memory according to the present inventive concept. Referring to FIG. 25, a computing system 300 includes a processor 310, a memory controller 320, input devices 330, output devices 340, a flash memory 350 and a main memory device 360. In the drawing, a solid line represents a system bus through which data or an instruction passes.

The memory controller 320 and the flash memory 350 can constitute a memory card. The processor 310, the input devices 330, the output devices 340 and the main memory device 360 can constitute a host using a memory card as a memory device. The computing system 300 according to the present inventive concept receives data from an external device through input devices (e.g., a keyboard, a camera and so on). Inputted data may be a multimedia data such as an instruction by a user or an image data by a camera. The inputted data is stored in the flash memory 350 or the main memory device 360.

A result processed by the processor 310 is stored in the flash memory 350 and the main memory device 360. The output devices 340 output data stored in the flash memory 350 and the main memory device 360. The output devices 340 output digital data as a type that a man can sense. For example, the output device 340 includes a display or a speaker. The read method according to the present inventive concept is applied to the flash memory 350. As reliability of the flash memory 350 is improved, an integration and reliability of the computing system 300 is also improved.

The flash memory 350 and/or the memory controller 320 may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat-pack (TQFP), small outline (SOIC), shrink small outline package (SSOP), thin small outline (TSOP), thin quad flat pack (TQFP), system in package (SIP), multi chip package (MCP), wafer-level fabricated package (WFP), wafer-level processed stack package (WSP).

A power supply portion (not shown) is also required to supply a power supply which is necessary to an operation of the computing system 300. If the computing system 300 is a mobile device, a battery for supplying an operation power supply of the computing system 300 is additionally required.

Figure 26:
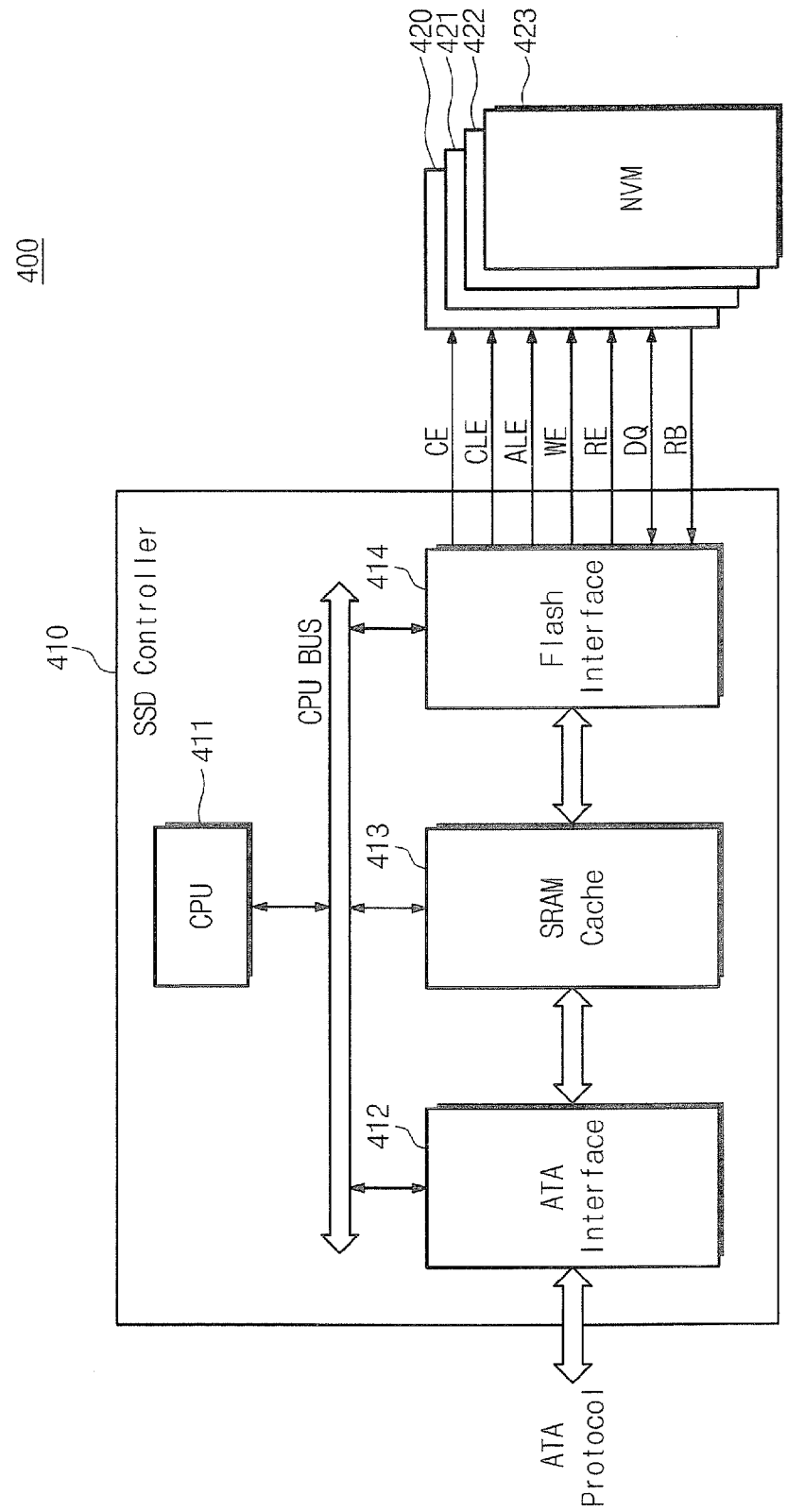
FIG. 26 is a block diagram illustrating a structure of SSD system according to the present inventive concept.

FIG. 26 is a block diagram illustrating a structure of SSD system according to the present inventive concept. Referring to FIG. 26, a SSD system 400 includes a SSD controller 410 and flash memories 420 through 423.

A nonvolatile memory device according to the present inventive concept may be applied to a solid state drive (SSD). Recently, a SSD device anticipated to replace a hard disk drive (HDD) is in the limelight in a next generation market. A SSD stores data using memory chips such as a flash memory instead of a rotating plate used in a general hard disk drive. A SSD has advantages of a high speed, low power consumption and a strong resistance against an external impact compared with a hard disk drive (HDD) which is mechanically moving.

Referring back to FIG. 26, a central processing unit 411 determines or controls whether receiving data from a host to store the data from the host in a flash memory or reading data stored in a flash memory to transmit it to the host. An ATA interface 412 exchanges data with the host according to a control of the central processing unit 411. The ATA interface 412 includes a serial ATA (S-ATA) standard and a parallel ATA (P-ATA) standard. The ATA interface 412 fetches an instruction and an address to transmit them to the central processing unit 411 through a CPU bus. Data inputted from a host through the ATA interface 412 or data to be transmitted to the host is transmitted through SRAM cache 413 without passing through a CPU bus according to a control of the central processing unit 411.

The SRAM cache 413 temporally stores data moving between the host and the flash memories 420 through 423. Also, the SRAM cache 413 is used to store a program to be put in practice by the central processing unit 411. The SRAM cache 413 may be considered as a kind of a buffer memory and is not always necessary to be comprised of SRAM. A flash interface 414 exchanges data with nonvolatile memories used as a storage device. The flash interface 414 may be constituted so as to support a NAND flash memory, one-NAND flash memory or a multi-level flash memory. A non-volatile memory device according to the present inventive concept may be used as a mobile storage device. Accordingly, the nonvolatile memory device according to the present inventive concept may be used as a storage device such as a MP3, a digital camera, a PDA, an e-Book, a digital TV or computer.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A nonvolatile memory device comprising:
a memory cell array connected to a plurality of word lines; and
a voltage generator for supplying a select read voltage to a select word line and an unselect read voltage to an unselect word line among the plurality of word lines when a read operation is performed,
wherein the voltage generator generates the unselect read voltage having different level according to whether the unselect word line is adjacent to the select word line or not; and
wherein the voltage generator supplies an unselect read voltage to at least one between an upper word line and a lower word line adjacent to the select word line when a threshold voltage of a select memory cell connected to the select word line is decreased, the unselect read voltage being lower than unselect read voltages supplied to other unselect word lines.

2. A nonvolatile memory device comprising:
a memory cell array connected to a plurality of word lines; and
a voltage generator for supplying a select read voltage to a select word line and an unselect read voltage to an unselect word line among the plurality of word lines when a read operation is performed,
wherein the voltage generator generates the unselect read voltage having different level according to whether the unselect word line is adjacent to the select word line or not; and
wherein the voltage generator supplies an unselect read voltage to at least one between an upper word line and a lower word line adjacent to the select word line when a threshold voltage of a select memory cell connected to the select word line is increased, the unselect read voltage being higher than unselect read voltages supplied to other unselect word lines.

3. A read method of a nonvolatile memory device, comprising:
performing a first read operation by supplying a select read voltage to a select word line and supplying an unselect read voltage to an unselect word line;
detecting whether an error occurs in the first read operation or not; and
performing a second read operation by changing a voltage of a word line adjacent to the select word line when an error occurs in the first read operation.

4. The read method of claim 3, wherein the voltage generator supplies an unselect read voltage to at least one between an upper word line and a lower word line adjacent to the select word line when a threshold voltage of a select memory cell connected to the select word line is decreased, the unselect read voltage being lower than unselect read voltages supplied to other unselect word lines.

5. The read method of claim 3, wherein the voltage generator supplies an unselect read voltage to at least one between an upper word line and a lower word line adjacent to the select word line when a threshold voltage of a select memory cell connected to the select word line is increased, the unselect read voltage being higher than unselect read voltages supplied to other unselect word lines.

6. The read method of claim 3, wherein whether an error occurs in the first read operation or not is detected by an error correction circuit.

7. The read method of claim 3, further comprising performing the second read operation by changing the select read voltage supplied to the select word line when an error occurs in the first read operation.

8. The read method of claim 3, further comprising performing a third read operation by changing the select read voltage supplied to the select word line when an error occurs in the second read operation.

9. The read method of claim 3, further comprising:
detecting whether the number of changing a voltage of a word line adjacent to the select word line exceeds the reference count or not when an error occurs in the second read operation; and
performing a third read operation by changing the select read voltage supplied to the select word line when the number of changing a voltage of a word line adjacent to the select word line exceeds the reference count.

10. A read method of a nonvolatile memory device, comprising:
performing a read operation by supplying a select read voltage to a monitoring word line and supplying an unselect read voltage to an unselect word line;
detecting whether data stored in a monitoring cell connected to the monitoring word line is normally readout or not; and
performing a read operation on the monitoring cell again by changing a voltage of a word line adjacent to the monitoring word line when data stored in the monitoring cell is not normally readout.

11. The read method of claim 10, further comprising performing a read operation on a select memory cell by supplying a voltage to a word line adjacent to a select word line when data stored in the monitoring cell is normally readout, the voltage having the same level as the voltage of the word line adjacent to the monitoring word line.

12. The read method of claim 10, further comprising performing a read operation on the monitoring cell by changing the select read voltage supplied to the monitoring word line when data stored in the monitoring cell is not normally readout and the number of changing the voltage of the word line adjacent to the monitoring word line exceeds the reference count.

* * * * *